United States Patent
Valouch et al.

(10) Patent No.: US 11,976,979 B2
(45) Date of Patent: May 7, 2024

(54) OPTICAL DETECTOR

(71) Applicant: trinamix GmbH, Ludwigshafen am Rhein (DE)

(72) Inventors: Sebastian Valouch, Ludwigshafen (DE); Alexander Klein, Ludwigshafen (DE); Sebastian Mueller, Ludwigshafen (DE); Wilfried Hermes, Ludwigshafen (DE); Robert Send, Karlsruhe (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 428 days.

(21) Appl. No.: 17/425,160

(22) PCT Filed: Jan. 28, 2020

(86) PCT No.: PCT/EP2020/051975
§ 371 (c)(1),
(2) Date: Jul. 22, 2021

(87) PCT Pub. No.: WO2020/157029
PCT Pub. Date: Aug. 6, 2020

(65) Prior Publication Data
US 2022/0120619 A1    Apr. 21, 2022

(30) Foreign Application Priority Data
Jan. 29, 2019   (EP) .................................... 19154155

(51) Int. Cl.
*G01J 5/20*      (2006.01)
*H01L 31/0232*  (2014.01)
(Continued)

(52) U.S. Cl.
CPC .......... *G01J 5/20* (2013.01); *H01L 31/02325* (2013.01); *H01L 31/02966* (2013.01);
(Continued)

(58) Field of Classification Search
CPC ........ G01J 1/0209; G01J 1/0214; G01J 5/022; G01J 5/045; G01J 5/06; G01J 5/0853;
(Continued)

(56) References Cited

U.S. PATENT DOCUMENTS

2007/0145420 A1    6/2007  Okada et al.
2009/0146234 A1    6/2009  Luo et al.
(Continued)

FOREIGN PATENT DOCUMENTS

JP     200185652 A     3/2001
WO     2012110924 A1   8/2012
(Continued)

OTHER PUBLICATIONS

International Search Report for corresponding PCT/EP2020/051975 dated Apr. 3, 2020, 9 Pages.

*Primary Examiner* — Mark R Gaworecki
(74) *Attorney, Agent, or Firm* — Armstrong Teasdale LLP

(57) ABSTRACT

Described herein is a detector for detecting optical radiation, especially within the infrared spectral range, specifically with regard to sensing at least one of transmissivity, absorption, emission and reflectivity, being capable of avoiding or diminishing a cross detection between sensor areas, specifically between adjacent sensor areas, thus, avoiding or diminishing a deterioration of a measurement based on the at least one sensor signal.

12 Claims, 3 Drawing Sheets

(51) Int. Cl.
*H01L 31/0296* (2006.01)
*H01L 31/0304* (2006.01)
*H01L 31/032* (2006.01)
*H01L 31/09* (2006.01)
*H01L 31/18* (2006.01)

(52) U.S. Cl.
CPC .... *H01L 31/0304* (2013.01); *H01L 31/03046* (2013.01); *H01L 31/0324* (2013.01); *H01L 31/09* (2013.01); *H01L 31/18* (2013.01)

(58) Field of Classification Search
CPC ........... G01J 5/20; G01J 5/28; H01L 27/1443; H01L 31/0216; H01L 31/02325; H01L 31/02966; H01L 31/0304; H01L 31/03046; H01L 31/0324; H01L 31/09; H01L 31/095; H01L 31/18
See application file for complete search history.

(56) References Cited

U.S. PATENT DOCUMENTS

2012/0146028 A1  6/2012  Oda et al.
2014/0124782 A1  5/2014  Jung et al.

FOREIGN PATENT DOCUMENTS

| WO | 2014097181 A1 | 6/2014 | |
|---|---|---|---|
| WO | 2016120392 A1 | 8/2016 | |
| WO | WO-2017094672 A1 * | 6/2017 | ................ G01J 1/02 |
| WO | 2018193045 A1 | 10/2018 | |

* cited by examiner

OPTICAL DETECTOR

CROSS-REFERENCE TO RELATED APPLICATIONS

This application is a U.S. National Phase Application of International Patent Application No. PCT/EP2020/051975, filed Jan. 28, 2020, which claims priority to European Patent Application No. 19154155.6, filed Jan. 29, 2019, the entire contents of which are hereby incorporated by reference herein.

FIELD OF THE INVENTION

The invention relates to a detector for an optical detection, in particular, of radiation within the infrared spectral range, specifically, with regard to sensing at least one optically conceivable property of an object. More particular, the detector may be used for determining transmissivity, absorption, emission, reflectivity, and/or a position of at least one object. Further, the invention relates to a method for manufacturing the optical detector and to various uses of the optical detector. Such devices, methods and uses can be employed for example in various areas of sensing and security technology. However, further applications are possible.

PRIOR ART

Optical detectors which are designed for sensing especially in the infrared spectral range (IR detectors), particularly, comprise thin sensor layers, preferably of lead sulfide (PbS) or lead selenide (PbSe) photoconductors, which are placed on a substrate layer. Herein, in order to achieve a high performance at least two sensor areas, preferably an array of sensor areas, may be provided, wherein adjacent sensor areas may, preferably, be separated by a gap. Since the IR spectral range comprises wavelengths from 760 nm to 1000 µm, a large partition of the incident light may be lost in a measurement application.

Therefore, in order to reduce this loss of incident light during a measurement in IR detectors, it is known to place a reflective gold coating on the backside of the substrate layer. Incident light beams which are neither absorbed nor reflected by any one of the sensor areas, or light beams that may reach the substrate layer in between two adjacent sensor areas that may be separated by a gap can pass the substrate layer. After passing the substrate layer, light beams may be reflected back at an opposite side of the substrate layer, at a circuit carrier carrying the substrate layer, or at an adhesive layer assembling the substrate layer and the circuit carrier. Consequently, the back-reflected light beams may be absorbed by one of the sensor areas. Thus, the back-reflected light beams can, generally, deteriorate a measurement result, specifically by reaching a different sensor area as the sensor area to which they may be assigned to and may, thus, contribute to a different sensor signal.

WO 2016/120392 A1 discloses a longitudinal optical sensor designed to generate at least one sensor signal in a manner dependent on an illumination of the sensor region. According to the FIP effect, the sensor signal, given the same total power of the illumination, is hereby dependent on a geometry of the illumination, in particular on a beam cross-section of the illumination on the sensor region. Furthermore, an optical detector is disclosed which has at least one evaluation device designated to generate at least one item of geometrical information from the sensor signal, in particular at least one item of geometrical information about the illumination and/or the object. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photo-conductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible.

US 2014/124782 A1 discloses an optical detector which comprises a substrate configured to include a semiconductor material, e.g. Si, Ge, or Si/Ge, as well as a read-out integrated circuit, a sensor layer comprising a chalcogenide material being capable of serving both as an absorption layer and a conversion layer, a detection part electrically connected to the sensor layer and configured to detect a change in resistance of the sensor layer, which may be caused by incident infrared light or heat generated therefrom, an interposition layer located between the substrate and the sensor layer, wherein the interposition layer includes a reflection layer as well as an isolation layer which are sequentially stacked on the substrate.

US 2012/146028 A1 discloses a further optical detector comprising a substrate, in particular a translucent glass substrate, such as a low-alkali glass substrate, or a quartz substrate, a base layer as a substrate layer, a semiconductor layer having at least an n-type region and a p-type region as a sensor layer, and a metal oxide layer as a reflective layer, wherein a portion of incident light that has passed through the semiconductor layer, subsequently, passes through the base layer and, eventually, reaches the upper surface of the metal oxide layer. Due to random asperities being provided on an upper surface of the metal oxide layer, the incident light cannot pass through the metal oxide layer; rather the metal oxide layer, thus, diffusely reflects the incident light.

US 2007/145420 A1 discloses a semiconductor device which solves a problem of reflection of a pattern of a wiring formed on a back surface of a semiconductor substrate on an output image. In a first embodiment, a reflection layer is formed between a light receiving element and a wiring layer which reflects incident IR radiation towards a light receiving element the without transmitting it to the wiring layer. In the alternative embodiment, an antireflection layer, e.g. a titan nitride layer formed by a sputtering method, a layer added with a pigment such as a black pigment, or an organic resin layer, is designed for absorbing incident IR radiation in order to prevent a transmission of the incident IR radiation.

WO 2018/193045 A1 discloses a detector for optical detection comprising a circuit carrier designed to carry at least one layer, wherein the circuit carrier is or comprises a printed circuit board; a reflective layer, the reflective layer being placed on a partition of the circuit carrier, wherein the reflective layer is designed to reflect the incident light beam, thereby generating at least one reflected light beam; a substrate layer, the substrate layer being directly or indirectly adjacent to the reflective layer, wherein the substrate layer is at least partially transparent with respect to the incident light beam; a sensor layer, the sensor layer being placed on the substrate layer, wherein the sensor layer is designed to generate at least one sensor signal in a manner dependent on an illumination of the sensor layer by the incident light beam and the reflected light beam; and an evaluation device designed to generate at least one item of information by evaluating the sensor signal; and at least two individual electrical contacts contacting the sensor layer, wherein the electrical contacts are designed to transmit the sensor signal via the circuit carrier to the evaluation device. In addition, a detector system, a human-machine interface, an entertainment device, a tracking system and a camera is presented, each of which comprises the detector for optical detection as disclosed therein.

A circuit carrier which is designed to carry at least one layer, in particular, at least one sensor layer, may, preferably, be or comprise a printed circuit board, usually abbreviated to "PCB", which refers to an electrically non-conductive, planar substrate or board on which at least one sheet of an electrically conductive material is applied to, specifically laminated, onto the substrate. In particular, for a purpose of protecting electronic traces underneath from moisture and dust and for controlling a flow of molten solder, the printed circuit board may, generally, be coated with a resin layer which is, usually, denominated by the terms "solder mask" or "solder resist". Specifically, the resin layer may be or comprise a hardened resin or lacquer which can be applied to the substrate of the printed circuit board by using a silkscreen process. For this purpose, a large blob of solder mask oil can be dragged across a screen mesh which is being placed on the printed circuit board underneath.

Herein, the solder mask may, preferably, comprise colored pigments, wherein green is a particularly preferred color. Currently, green proves to be the only available color which allows reliably producing solder mask dams of 0.10 mm, followed by red, yellow and blue which allow producing solder mask dams of 0.12 mm dams, whereas with black and white only solder mask dams of 0.15 mm are obtainable. Small solder mask dams are vital for integrated circuits and fine pitch components for in preventing solder bridges from forming. Further, the solder mask oil is required to perform as an electrical insulator, to adhere evenly to the substrate, to cure well and to look visually appealing. As a result, black turns out to be the worst color for a visual inspection of the traces, specifically due to a low contrast. Even in automated optical inspections, black solder masks are avoided due to a higher failure rate.

The silkscreen process as described above may, further, be used in applying a legend on top of a solder mask, wherein the legend, preferably, has a different color compared to the color of the solder mask. Herein, the legend may indicate test points, part numbers, bar codes, warning symbols, company logos, manufacturer marks, or other kinds of information. As an alternative, legends may be printed on the top of a solder mask by using liquid photo imaging or an inkjet process using so-denoted "legend inks". Common colors as used hereby are black, white, and yellow. Herein, "liquid photo imaging" refers to a printing process which comprises coating and UV developing of an epoxy resin on the printed circuit board, wherein, preferably, a white material may be used instead of the usual green color of the solder mask.

For further information concerning printed circuit boards, reference may be made to the brochure *Rigid PCB Design For Manufacturability Guide*, Bittele Electronics Inc., 2017, available under https://www.7pcb.com/Upload_file/DFM_Guidelines.pdf, which is incorporated here by reference. In particular, it is emphasized therein in Section 7.2.1, page 40, that black is a glossy color which looks good but has almost no contrast between traces, planes and empty space, and also absorbs heat which increases the danger of overheating for sensitive components.

Despite the advantages as implied by the above-mentioned devices, there still is a need for improvements with respect to a simple and cost-efficient optical detector, which is capable of providing reliable measurements.

Problem Addressed by the Invention

Therefore, a problem addressed by the present invention is that of specifying a device and a method for an optical detection which at least substantially avoids the disadvantages of known devices and methods of this type.

In particular, providing an improved simple, cost-efficient and, still, reliable optical detector for detecting optical radiation, especially within the infrared spectral range, would be desirable, specifically with regard to sensing at least one of transmissivity, absorption, emission and reflectivity. Hereby, the optical detector would, preferably, be arranged in a manner to be able to avoid back reflections that can be absorbed by at least one of the sensor areas as far as possible. Moreover, since the production process for optical detectors which comprise a photoconductive material selected from lead sulfide (PbS), lead selenide (PbSe), a solid solution and/or a doped variant thereof is particularly sensitive to changes, an elimination or at least a reduction of the back reflections should, preferably, be achieved by affecting the production process of the optical detector as little a possible.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have" "comprise" comprise and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical detector for an optical detection of an incident light beam is disclosed. Herein, the optical detector according to the present invention comprises:

a circuit carrier designed to carry at least one layer;

at least one absorptive layer, the absorptive layer being placed on a partition of the circuit carrier, wherein the absorptive layer is designed to at least partially absorb the incident light beam, wherein the absorptive layer incorporates infrared absorbing pigments;

a substrate layer, the substrate layer being directly or indirectly adjacent to the absorptive layer, wherein the substrate layer is at least partially transparent with respect to the incident light beam;

at least one sensor area, each of the sensor areas being placed on the substrate layer, wherein each of the sensor areas is designed to generate at least one sensor signal in a manner dependent on an illumination of the sensor area by the incident light beam; and an evaluation device designed to generate at least one item of information by evaluating the at least one sensor signal.

Herein, the listed components may be separate components. Alternatively, two or more of the components may be integrated into one component. Preferably, the evaluation device may be formed as a separate evaluation device independent from the other optical components, but may preferably be connected to the circuit carrier in order to receive the sensor signal. However, other kinds of arrangements may also be feasible.

As generally used, the term "optical detector" may, particularly, be designed for detecting at least one wavelength in at least a partition of a spectral range, wherein the desired partition of the spectral range may be selected from the ultraviolet (UV) spectral range, the visible (VIS) spectral range and/or the infrared (IR) spectral range. For the optical detector or, simply, the detector according the present invention, the IR range, i.e. the spectral range of 760 nm to 1000 µm, may, especially, be preferred.

According to the present invention, the detector comprises a circuit carrier which is designed to carry at least one element. As used herein, the term "circuit carrier" refers to a carrier provided for carrying at least one electronical, electrical, and/or optical element, in particular a plurality of such elements, in particular an arrangement comprising a plurality of elements, specifically comprising at least one absorptive layer, a substrate layer, and at least one sensor area as described below in more detail, wherein the carrier is designed to mechanically support and electrically connect these electronical, electrical, and/or optical elements. In a preferred embodiment, the circuit carrier may be a planar circuit carrier. As generally used, the term "planar" refers to a body which comprises extensions in two dimensions, typically denominated as "surface" of the planar body, which exceed the extension in a third dimension, usually denoted by "thickness" of the planar body, by a factor of at least 10, preferably of at least 100, more preferred of at least 1000. In an alternative embodiment, non-planar circuit carriers may also be applicable, in particular one of a flex printed circuit (FPC) or a mechatronic integrated device (MID).

In a particularly preferred embodiment, the circuit carrier may be or comprise a printed circuit board, usually abbreviated to "PCB", which refers to an electrically non-conductive, planar substrate, which may also be denoted as a board, on which at least one sheet of an electrically conductive material, in particular a copper layer, is applied to, specifically laminated, onto the substrate. Other terms which refer to this type of circuit carrier which, in addition, comprises one or more electronical, electrical, and/or optical elements may also be denoted as a printed circuit assembly, short "PCA", a printed circuit board assembly, short "PCB assembly" or "PCBA", circuit card assembly or short "CCA" or simply "card". In the PCB, the insulating substrate may comprise a glass epoxy, wherein a cotton paper impregnated with a phenolic resin, typically tan or brown, may also be sued as the substrate material. Depending on a number of sheets, the printed circuit board may be a single-sided PCB, a two-layer or double-sided PCB, or a multi-layer PCB, wherein different sheets are connected with each other by using so-called "vias". For the purposes of the present invention, an application of a single-sided PCB may be sufficient; however other kinds of printed circuit boards may also be applicable. A double-sided PCB may have metal on both sides while a multi-layer PCB may be designed by sandwiching additional metal layers between further layers of insulating material. Further, by using two double-sided PCBs, a four-layer PCB may be generated, wherein two first layers may be used as power a supply and a ground plane whereas two second layers may be used as a signal wiring between electrical components. In a multi-layer PCB, the layers can be laminated together in an alternating manner, such as in an order of metal, substrate, metal, substrate, metal, etc., wherein each metal layer may be individually etched and wherein any internal vias may be plated through before the multiple layers are laminated together. Further, the vias may be or comprise copper-plated holes which can, preferably, be designed as electrical tunnels through the insulating substrate. For this purpose, through-hole components may also be used which may, usually, be mounted by wire leads passing through the substrate and soldered to tracks or traces on the other side.

Electrically conductive patterns or structures, such as tracks, traces, pads, vias for generating connections between adjacent sheets, or features such as solid conductive areas, may be introduced into the one or more sheets, preferably by removing a partition of the sheet, in particular by etching, silk screen printing, photoengraving, PCB milling, or laser resist ablation, at selected regions in the sheet, whereby the desired structures are created. The etching can, preferably, be performed by using a photoresist material being coated onto the PCB which is, subsequently, exposed to light, whereby the desired pattern may be generated. Herein, the photoresist material may be adapted to protect the metal from dissolution into an etching solution. After etching, the PCB may, finally, be cleaned. By using this process, a particular PCB pattern can be mass-reproduced. However, other kinds of separation processes or connection processes may also be applicable. By way of example, a track introduced into the PCB may function as a wire being fixed at a selected position, wherein adjacent tracks can be insulated from each other, on one hand, by the substrate material and, on the other hand, by an electrically isolating fluid under conditions at which the PCB is used, specifically by air or a protective gas which may be present in a gap between the adjacent tracks. In addition, a surface of the PCB may have a coating, also denoted as a solder resist, which may be designed for protecting the metal, specifically the copper, within the at least one sheet from detrimental environmental effects, such as corrosion, thus, reducing a chance that undesired short circuits may be generated by a solder or by stray bare wires. In a multi-layer PCB, only outer metal layers may be coated in this manner since inner metal layers are protected by the adjacent substrate layers.

Further, the electronical, electrical, and/or optical elements or components may be placed onto the substrate, such as by soldering, welding, or depositing, or, additionally or as an alternative, be embedded into the circuit carrier, such as by placing them into seats designated in the substrate for this purpose and/or by deliberately removing a partition of the circuit carrier. Preferably, surface mount components, specifically transistors, diodes, IC chips, resistors and capacitors, may, thus, be attached to the PCB by using electrical conductive leads which adjoin the respective component to metal tracks, traces, or areas on the same side of the substrate. As an alternative, through-hole mounting may be used, in particular, for extended or voluminous components, such as electrolytic capacitors or connectors. As a further alternative, components may be embedded within the substrate. In addition, the PCB may, further, comprise an area on the PCB, usually denoted by the term "silkscreen", on which an identifying text, such as a legend identifying the components or test points, may be printed. For further embodiments of the PCB, reference may be made to https://en.wikipedia.org/wiki/Printed_circuit_board, which is incorporated here by reference. However, other kinds of circuit carriers may also be applicable.

Further according to the present invention, the detector comprises an absorptive layer, wherein the absorptive layer is placed on a partition of the circuit carrier, in particular on a partition of the surface of the circuit carrier, more particular on a partition of the surface of the printed circuit board. As generally used, the terms "absorptive layer" or "absorbing layer" refer to a layer which is designed to at least partially absorb the incident light beam, preferably, in a manner that the incident light beam after it has, at least partially, transmitted the at least one sensor area before may neither be reflected by the absorptive layer nor by the circuit carrier back to the at least one sensor area. As used herein, the term "at least partially absorb" refers to a grade of absorption, also denoted by the term "absorbance", of an incident light beam by the absorptive layer of 50% to 100%, preferably of 80% to 100%, more preferred of 95% to 100%, in particular of 99% to 100%. Alternatively, instead of using the absorbance a, a transmission t of the incident light beam may be considered, wherein the transmission may be defined as t=1−a. Consequently, the transmission of the absorptive layer as used for the present invention may be 0% to 50%, preferably of 0% to 20%, more preferred of 0% to 5%, in particular of 0% to 1%.

As generally used, the term "light beam" refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space.

In accordance with the present invention, the absorptive layer may be designed to exhibit this grade of absorption over at least a partition of the infrared spectral range of wavelengths from 760 nm to 1000 µm, preferably, at least over the near infrared (NIR) spectral range of 760 nm to 1.4 µm or the far infrared (FIR) spectral range of 15 µm to 1000 µm as, however, more preferred over at least the mid infrared (MIR) from 1.5 µm to 15 µm. In particular, the absorptive layer may be designed to exhibit this grade of absorption over at least a partition, preferably of at least 50%, more preferred of at least 90%, most preferred of at least 99%, of the sensitive range of the at least one sensor area as described below in more detail. This arrangement may, thus, avoid or at least diminish that back-reflected light beams may be absorbed by one of the sensor areas. As a result, no or at least less back-reflected light beams may be capable of deteriorating a measurement result, specifically by reaching a different sensor area as the sensor area to which they may be assigned to and, thus, contributing to a different sensor signal during a measurement in this kind of detector.

The absorptive layer may exhibit a thickness which may be selected in order to provide a close and stable connection between the adjacently assembled layers, specifically the substrate layer and the circuit carrier. In particular depending on a material which is selected for the absorptive layer, the thickness of the absorptive layer may, therefore, be of 100 nm to 350 µm, more preferred of 250 nm to 120 µm, most preferred of 1 µm to 65 µm. Herein, the absorptive layer may, preferably, be exactly one continuous layer which may be placed adjacently with respect to both the substrate layer and the circuit carrier.

In addition to providing the fixed arrangement between the substrate layer and the circuit carrier, the absorptive layer can be an adhesive layer, thus, comprising at least one adhesive substance which may be designed for assembling two adjacent layers, specifically the substrate layer and the circuit carrier, in a manner that they are resistive to a separation, such as by enabling the separation only through an application of an increased force compared to a binding of the adjacent layers with adhesive. Herein, the adhesive layer may, especially, be applied in a manner that no gap may be left nor generated, on one hand, between the substrate layer and the absorptive layer and, on the other hand, between the absorptive layer and the circuit carrier. For this purpose, the absorptive layer may, in particular, comprise an organic adhesive or glue which may, preferably, be selected from one or more of epoxy, polypropylene, polyvinyl chloride, polyvinyl acetate, polyurethane, polysulfide, silyl modified polymer, polyester, silicone, polyol, polyvinyl alcohol, ethylene-vinyl-acetate, cyano-acrylate, polyacrylate, polyethylene, polyvinylpyrrolidone, acrylonitrile, rubber cement, recorcinol glue, or polyamide.

Alternatively or in addition, the at least one absorptive layer can be a resin layer, thus, comprising at least one hardened resin which may be designed for application on a surface of the circuit carrier, specifically of the printed circuit board. Herein, the resin may, in particular, be selected from one or more of an epoxy, a lacquer, an acrylic resin, a polyurethane, polysiloxane, or an alkyd resin. As already indicated above, the resin layer can, preferably, be applied to the surface of the circuit carrier by using a silkscreen process. For this purpose, a large blob of solder mask oil can be dragged across a screen mesh which may be placed on the circuit carrier underneath.

Thus, it may be emphasized that the optical detector according to the present invention may comprise a single individual absorptive layer or, as alternative, an arrangement of at least two individual absorptive layers, wherein the at least two absorptive layers may, preferably, be arranged in a stacked fashion. In general, the at least one absorptive layer may be selected from a resin layer, an adhesive layer, or a combined layer which may comprise a hardened resin that may, concurrently, exhibit adhesive properties. By way of example, the resin layer may be directly placed on the circuit carrier, whereupon an adhesive layer may be directly placed on the resin layer, and whereupon the substrate layer may be directly placed on the adhesive layer. However, other kinds of arrangements of the layers which may include the mentioned layers but also further layers, may also be feasible.

The absorptive layer may, thus, comprise at least one of a resin layer or an adhesive layer, each of which incorporates the infrared absorbing pigments which exhibit a grade of absorption as describe above in more detail. As generally used, the term "pigment" refers to a substance which is designated to alter a color of an incident light beam. Not wishing to be bound by theory, the color of the incident light beam can be altered by absorbing a partition of the incident light beam within a particular spectral range and, alternatively or in addition, by luminescence, specifically fluorescence or phosphorescence, affecting the incident light beam. In addition, the term "pigment", usually, refers to a substance which is considered as particularly stable with respect to external influences, i.e. keeping the properties of the pigment with respect to altering the color of the incident light stable over long periods of time, such as months, years, decades, centuries, or millennia. Depending on the at least one pigment as selected, a concentration of the pigments within the absorptive layer, specifically in a phase comprising the hardened resin or the hardened organic adhesive, respectively, may be selected of 0.1 wt. % to wt. 10%, preferably of 0.3 wt. % to 5 wt. %, in particular 0.5 wt. % to 2 wt. %.

In a particularly preferred embodiment, the infrared absorbing pigment may be selected from a group consisting of carbon black, graphite, carbon, vantablack, $LaB_6$, copper bronze, copper chromite black, cobalt chromite black, and manganese ferrite black. As generally used, vantablack is an acronym based on vertically aligned carbon nanotube arrays. Herein, carbon black may, particularly, be preferred as an easily available and low-cost material. For further kinds of infrared absorbing pigments reference may be made to C. E. Kennedy, *Review of Mid-to High-Temperature Solar Selective Absorber Materials*, July 2002, Technical Report, NREL/TP-520-31267, and Gerhard Pfaff, *Inorganic Pigments*, p. 126, De Gruyter, Berlin, 2017, which are incorporated here by reference. However, additional kinds of infrared absorbing pigments may also be feasible.

In further embodiments, the absorptive layer may, alternatively or in addition, exhibit one or more chemical or physical properties which may prove to be advantageous for the optical sensor. Thus, in a preferred embodiment, the absorptive layer may have a refractive index which may, in particular, be adapted for limiting a back-reflection at an interface between the substrate layer and the absorptive layer. As a result, less light beams may be back-reflected to the sensor areas where they might be capable of deteriorating a measurement result. Further properties of the absorptive layer may also be conceivable.

As a result and in particular contrast to WO 2018/193045 A1, wherein a reflective layer, specifically a reflective gold coating at the same location as the absorptive layer according to the present invention was disclosed in order to increase the back-reflection in an economic manner, the present application attempts to avoid the back-reflection as far as possible. Whereas increasing the back-reflection, in particular according to WO 2018/193045 A1 may, especially, be advantageous for single pixel applications, i.e. optical detectors which comprise a single sensor layer, in order to increase a signal-to-noise ratio by redirecting the light beam to the sensor layer, decreasing the back-reflection in accordance to the present invention may, especially, be advantageous for multi pixel applications, i.e. optical detectors which comprise more than one sensor area, in particular to avoid or at least diminish cross detection between sensor areas, specifically between adjacent sensor areas, thus, avoiding or at least diminishing deteriorating a measurement based on the at least one sensor signal.

Further according to the present invention, the detector comprises at least one sensor area comprising at least one photosensitive material, wherein each of the sensor areas may function as a sensor region of the detector. As used herein, the "sensor region" is considered as a partition of the detector being designed to receive the illumination of the detector by the light beam, wherein the illumination in a manner as received by the sensor region may trigger the generation of the at least one sensor signal, wherein the generation of the sensor signal may be governed by a defined relationship between the sensor signal and the manner of the illumination of the sensor region.

Preferably, the optical detector may comprise at least two individual sensor areas, preferably an array of individual sensor areas, whose top surfaces may, in particular, be arranged in form of a sensor layer, wherein adjacent sensor areas may be separated with respect to each other by a gap. As a result, multi pixel applications may be feasible, according to which the incident light beam may impinge only on a partial number of the individual sensor areas each of which, subsequently, generates the corresponding sensor signal. In this fashion, a differentiation between various incident light beams with respect to at least one property of the incident light beam may be made, specifically, with respect to a location of impingement of the light beam or with regard to a physical property, including but not limited to a color, or a polarization.

While in general, cross detection can easily occur between sensor areas, in particular between adjacent sensor areas, in an optical detector having more than a single sensor area, which, thus, allows a multi pixel application, however, the present invention allows avoiding, at least diminishing the cross detection between sensor areas, in particular between adjacent sensor areas, in the optical detector having at least two single sensor areas. However, the person skilled in the art who is starting from the disclosure of US 2007/145420 A1, cannot find any motivation there in order to achieve this advantage. Although US 2007/145420 A1 discloses an anti-reflective layer, it indicates a completely different motivation for replacing a reflection layer by the anti-reflective layer of FIG. 5:

The anti-reflection layer absorbs an infrared ray entering from the light transparent substrate toward a wiring layer through the semiconductor substrate, and has a function of preventing light transmission;

Further, this effectively prevents an infrared ray from being reflected toward a light receiving element by the wiring layer;

Therefore, any pattern of the wiring layer or a conductive terminal formed on the back surface of the semiconductor substrate is effectively prevented from being reflected on an output image, or by the anti-reflective layer of FIG. 8, respectively, wherein the antireflection layer covers a whole side surface of the semiconductor substrate:

This structure prevents an infrared ray passing through the light transparent substrate from being reflected toward the light receiving element by the wiring layer formed along the side surface of the semiconductor substrate, which prevents the pattern of the wiring layer formed along the side surface of the semiconductor substrate from being reflected on an output image; and The light receiving element accurately receives only light entering from the light transparent substrate, thereby enhancing the detection accuracy of the light receiving element.

Consequently, since US 2007/145420 A1 is silent about cross talk between sensor areas, in particular between adjacent sensor areas, and can, therefore, not provide any motivation to the person skilled in the art to use this disclosure for the above-indicated purposes. Rather, it leaves the person skilled in the art without providing any hint for using the optical detector comprising at least two individual sensor areas.

Further, also a combination of US 2007/145420 A1 and WO 2018/193045 A1 cannot provide any motivation to the person skilled in the art. Rather, WO 2018/193045 A1 proposes a reflective layer in order to enhance the detection intensity in a single sensor layer (single pixel application). Apparently, the person skilled in the art cannot derive any motivation from therefrom for amending the detector of US 2007/145420 A1 to arrive at the optical detector comprising at least two individual sensor areas.

The sensor signal may generally be an arbitrary signal indicative of a desired optical property to be measured, in particular a transmissivity, absorption, emission and reflectivity of an incident light beam, or a position of an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

In a preferred embodiment, the at least one photosensitive material as comprised by the at least one sensor area may be, further, be selected from a group consisting of dye solar cells, photoconductive materials, and quantum dots, wherein the photoconductive materials are particularly preferred. For further details with regard to the dye solar cells, reference may be made to WO 2012/110924 A1 and WO 2014/097181 A1.

In particular based on WO 2016/120392 A1, the term "photoconductive material", as used herein, refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. Thus, the photoconductive material may, preferably, comprise an inorganic photoconductive material, in particular, a thin film semiconductor or a nanoparticulate photoconductive material; an organic photoconductive material, in particular an organic semiconductor; a combination, a solid solution, and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary PbSe may be solved in PbS leading to $PbS_{1-x}Se_x$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide. However, other inorganic photoconductive materials may equally be appropriate.

As mentioned above, the chalcogenide, may preferably be selected from a group comprising sulfide chalcogenides, selenide chalcogenides, telluride chalcogenides, ternary chalcogenides, quaternary and higher chalcogenides, may preferably be appropriate to be used for the at least one sensor area. As generally used, the term "chalcogenide" refers to a compound which may comprise a group 16 element of the periodic table apart from an oxide, i.e. a sulfide, a selenide, and a telluride. In particular, the photoconductive material may be or comprise a sulfide chalcogenide, preferably lead sulfide (PbS), a selenide chalcogenide, preferably lead selenide (PbSe), a telluride chalcogenide, preferably, cadmium telluride (CdTe), or a ternary chalcogenide is, preferably mercury zinc telluride (HgZnTe; MZT). Since at least the mentioned preferred photoconductive materials are, generally, known to exhibit a distinctive absorption characteristic within the infrared spectral range, the sensor area which comprises one of the mentioned photoconductive materials may, preferably, be used as an infrared sensor. However, other embodiments and/or other photoconductive materials, in particular, the photoconductive materials as described below, may also be feasible.

In particular, the sulfide chalcogenide may be selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS or $Cu_2S$), cobalt sulfide (CoS), nickel sulfide (NiS), molybdenum disulfide ($MoS_2$), iron disulfide ($FeS_2$), and chromium trisulfide ($CrS_3$).

In particular, the selenide chalcogenide may be selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe or $Cu_2Se$), molybdenum diselenide ($MoSe_2$), tin selenide (SnSe), and cobalt selenide (CoSe), and indium selenide ($In_2Se_3$). Further, solid solutions and/or doped variants of the mentioned compounds or of other compounds of this kind may also be feasible.

In particular, the telluride chalcogenide may be selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (Core), silver telluride ($Ag_2Te$), and indium telluride ($In_2Te_3$). Further, solid solutions and/or doped variants of the mentioned compounds or of other compounds of this kind may also be feasible.

In particular, the ternary chalcogenide may be selected from a group comprising mercury cadmium telluride (HgCdTe; MCT), mercury zinc telluride (HgZnTe), mercury cadmium sulfide (HgCdS), lead cadmium sulfide (PbCdS), lead mercury sulfide (PbHgS), copper indium disulfide ($CuInS_2$; CIS), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), cadmium selenite ($CdSeO_3$), cadmium zinc telluride (CdZnTe), and cadmium zinc selenide (CdZnSe), further combinations by applying compounds from the above listed binary chalcogenides and/or binary III-V-compounds as listed below. Further, solid solutions and/or doped variants of the mentioned compounds or of other compounds of this kind may also be feasible.

With regard to quaternary and higher chalcogenides, this kind of material may be selected from a quaternary and higher chalcogenide which may be known to exhibit suitable photoconductive properties. In particular, a compound having a composition of $Cu(In, Ga)S/Se_2$ or of $Cu_2ZnSn(S/Se)_4$ may be feasible for this purpose.

With regard to the III-V compound, this kind of semiconducting material may be selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb). Further, solid solutions and/or doped variants of the mentioned compounds or of other compounds of this kind may also be feasible.

With regard to the II-VI compound, this kind of semiconducting material may be selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe).

However, other II-VI compounds may be feasible. Further, solid solutions of the mentioned compounds or of other compounds of this kind may also be applicable.

With regard to the metal oxides, this kind of semiconducting material may be selected from a known metal oxide which may exhibit photoconductive properties, particularly from the group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), ferrite ($Fe_3O_4$), and perovskite oxides ($ABO_3$, wherein A is a divalent cation, and B a tetravalent cation). In addition, ternary, quarternary or higher metal oxides may also be applicable. Furthermore, solid solutions and/or doped variants of the mentioned compounds or of other compounds of this kind, which could be stoichiometric compounds or off-stoichiometric compounds, may also be feasible. As explained later in more detail, it may be preferable to select a metal oxide which might, simultaneously, also exhibit transparent or translucent properties.

With regard to a group IV element or compound, this kind of semiconducting material may be selected from a group comprising doped diamond (C), doped silicon (Si), silicon carbide (SiC), and silicon germanium (SiGe), wherein the semiconducting material may be selected from a crystalline material, a microcrystalline material, or, preferably, from an amorphous material. As generally used, the term "amorphous" refers to a non-crystalline allotropic phase of the semiconducting material. In particular, the photoconductive material may comprise at least one hydrogenated amorphous semiconducting material, wherein the amorphous material has, in addition, been passivated by applying hydrogen to the material, whereby, without wishing to be bound by theory, a number of dangling bonds within the material appear to have been reduced by several orders of magnitude.

In particular, the hydrogenated amorphous semiconducting material may be selected from a group consisting of hydrogenated amorphous silicon (a-Si:H), a hydrogenated amorphous silicon carbon alloy (a-SiC:H), or a hydrogenated amorphous germanium silicon alloy (a-GeSi:H). However, other kinds of materials, such as hydrogenated microcrystalline silicon (pc-Si:H), may also be used for these purposes.

Alternatively or in addition, the organic photoconductive material may, in particular, be or comprise an organic compound, in particular an organic compound which may be known to comprise appropriate photoconductive properties, preferably polyvinylcarbazole, a compound which is generally used in xerography. However, a large number of other organic molecules which are described in WO 2016/120392 A1 in more detail may also be feasible.

In a further preferred embodiment, the photoconductive material may be provided in form of a colloidal film which may comprise quantum dots. This particular state of the photoconductive material which may exhibit slightly or significantly modified chemical and/or physical properties with respect to a homogeneous layer of the same material may, thus, also be denoted as colloidal quantum dots (CQD). As used herein, the term "quantum dots" refers to a state of the photoconductive material in which the photoconductive material may comprise electrically conducting particles, such as electrons or holes, which are confined in all three spatial dimensions to a small volume that is usually denominated as a "dot".

Herein, the quantum dots may exhibit a size which can, for simplicity, be considered as diameter of a sphere that might approximate the mentioned volume of the particles. In this preferred embodiment, the quantum dots of the photoconductive material may, in particular, exhibit a size from 1 nm to 100 nm, preferably from 2 nm to 100 nm, more preferred from 2 nm to 15 nm, provided that the quantum dots actually comprised in a specific thin film may exhibit a size being below the thickness of the specific thin film. In practice, the quantum dots may comprise nanometer-scale semiconductor crystals which might be capped with surfactant molecules and dispersed in a solution in order to form the colloidal film. Herein, the surfactant molecules may be selected to allow determining an average distance between the individual quantum dots within the colloidal film, in particular, as a result from approximate spatial extensions of the selected surfactant molecules. Further, depending on the synthesis of ligands, quantum dots may exhibit hydrophilic or hydrophobic properties. The CQD can be produced by applying a gas-phase, a liquid-phase, or a solid-phase approach. Hereby, various ways for a synthesis of the CQD are possible, in particular by employing known processes such as thermal spraying, colloidal synthesis, or plasma synthesis. However, other production processes may also be feasible.

Further in this preferred embodiment, the photoconductive material used for the quantum dots may, preferably, be selected from one of the photoconductive materials as mentioned above, more particular, from the group comprising lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), a perovskite structure materials $ABC_3$, wherein A denotes an alkaline metal or an organic cation, B=Pb, Sn, or Cu, and C a halide, and copper zinc tin sulfide (CZTS). Further, solid solutions and/or doped variants of the mentioned compounds or of other compounds of this kind may also be feasible. Core shell structures of the materials of this kind of materials may also be feasible. However, kinds of other photoconductive materials may also be feasible.

Herein, each of the sensor areas which, in particular comprises the at least one photosensitive material, may be manufactured by applying at least one deposition method for depositing the at least one sensor area with top surfaces in form of a sensor layer on a surface of the substrate layer, wherein the deposition method may, preferably, be selected from the group consisting of: chemical bath deposition, vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques. As a result, each of the sensor areas may exhibit a thickness in the range 10 nm, preferably of 100 nm, in particular of 300 nm, to 100 μm, preferably to 10 μm, in particular to 5 μm, thus, exhibiting a thickness which may, however, be still below the wavelength of the incident beam or a fraction thereof, such as ½ or ¼ f the wavelength in the IR spectral range, i.e. from 760 nm to 1000 μm, especially, in the MidIR spectral range, i.e. from 1.5 μm to 15 μm.

In a particularly preferred embodiment, each of the sensor areas may be directly or indirectly applied to the substrate layer, especially, in a manner that no gap may be left nor generated between each of the sensor areas and the substrate layer. In order to allow a high transmission of the incident light beam to the absorptive layer, the substrate layer may at least partially be transparent with respect to both the incident light beam. For this purpose, the substrate layer may comprise a substrate material which may, preferably, be selected from glass, quartz, silicon (Si), a transparent conducting oxide (TCO), or a transparent organic polymer. In particular, the transparent conducting oxide (TCO) may be selected from the group consisting of aluminum oxide ($Al_2O_3$), titanium oxide ($TiO_2$), indium tin oxide (ITO), fluorine doped tin oxide ($SnO_2$:F; FTO), aluminum doped zinc oxide (AZO), magnesium oxide (MgO), or a perovskite transparent conducting oxide. However, depending on the desired wavelength range, other kinds of substrate materials may also be employed as the substrate layer.

In a particularly preferred embodiment of the present invention, the detector may further comprise at least two individual electrical contacts for each of the sensor which are designed to transmit the at least one sensor signal via the circuit carrier to the evaluation device. As used herein, the term "contacting the sensor area" refers to an electrically conductive connection between the respective contact and the corresponding sensor area which may be arranged in a manner that each of the electrical contacts may be placed on a location at a surface of the corresponding sensor area. For this purpose, the at least individual two electrical contacts may be applied at different locations of the photoconductive material comprised by the respective sensor area, especially, in a manner that at least two of the individual electrical contacts are electrically isolated with respect to each other. Herein, each of the at least two electrical contacts may, preferably, be arranged in a manner that a direct electrical contact between the respective electrode and the sensor area may be achieved, particularly in order to acquire the sensor signal with as little loss as possible, such as due to additional resistances in a transport path between the respective sensor area and the evaluation device. In an alternative embodiment, at least one of the sensor areas may be arranged in a setup which may allow transmitting the sensor signal contactless to the evaluation device.

Consequently, upon impingement of the sensor region by the light beam the at least two electrical contacts may provide the sensor signal which depends on the illumination of the at least one sensor area to the evaluation device. Herein, the electrical contacts may comprise an evaporated metal layer which may easily be provided by known evaporation techniques. In particular, the evaporated metal layer may comprise one or more of gold, silver, aluminum, platinum, magnesium, chromium, or titanium. Alternatively, at least one of the electrical contacts may comprise a layer of highly conductive graphene.

In this kind of material, the electrical current may be guided via at least one first electrical contact through the material to at least one second electrical contact, wherein the first electrical contact may be isolated from the second electrical contact while both the first electrical contact and the second electrical contact may be in direct connection with the material. For this purpose, the direct connection may be provided by any known measure known from the state of the art, such as wire bonding, plating, welding, soldering, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

In a particularly preferred embodiment, wire bonds may be used for providing a direct connection between each of the electrical contacts contacting the sensor area and a corresponding receiving contact, such as a contact pad, which may, preferably, be further placed on the circuit carrier, in particular, on the printed circuit board (PCB). This kind of arrangement may allow easily contacting the at least one sensor area to an evaluation device, wherein the electrical contacts may be designed to transmit the sensor signal to the circuit carrier and, subsequently, to the evaluation device.

In a further, particularly preferred embodiment of the present invention, the detector may, additionally, comprise a cover layer. Herein, the cover layer may be deposited on the at least one sensor area, preferably, in a manner that it may directly contact the sensor area. In a preferred embodiment, the cover layer may be deposited in a fashion that it may fully cover an accessible surface of the sensor area. Preferably, the cover layer may be an amorphous layer comprising at least one metal-containing compound. However, other kinds of cover layers may also be feasible. Preferably, at least one deposition method may be used for depositing the cover layer.

In a particular preferred embodiment, the cover layer may fully cover the accessible surface of each of the sensor areas in order to be adapted for providing an encapsulation for the at least one sensor area. As used herein the term "encapsulation" may refer to a package, preferably, an hermetic package, especially, in order to avoid as far as possible a partial or full degradation of the sensor area or a partition thereof, in particular, by external influence, such as by humidity and/or by oxygen comprised in a surrounding atmosphere. Herein, the package may, preferably, be adapted to cover all accessible surfaces of each of the sensor areas, wherein it may be taken into account that the sensor area may be deposited on a substrate layer which may already be adapted to protect a partition of the surfaces of the sensor area. In other words, the substrate layer and the cover layer may be adapted in a fashion that they can cooperate in order to accomplish a packaging, preferably a hermetic packaging, of each of the sensor areas.

In a particularly preferred embodiment, the cover layer may exhibit a thickness of 10 nm to 600 nm, preferably of 20 nm to 200 nm, more preferred of 40 nm to 100 nm, most preferred of 50 to 75 nm. This thickness may, particularly, reflect the amount of metal-containing compounds within the cover layer that may be advantageous to achieve the function of providing encapsulation for each of the sensor areas. Herein, the cover layer may be a conformal layer with respect to the adjacent surface of each of the sensor areas. As generally used, the thickness of the conformal layer may, thus, follow the corresponding surface of the at least one sensor area within a deviation of ±50 nm, preferably of ±20 nm, mostly preferred of ±10 nm, wherein the deviation may occur over at least for at least 90%, preferably for at least 95%, mostly preferred for at least 99%, of a surface of the cover layer, hereby leaving aside any contamination or imperfection that may be present on the surface of the cover layer.

Further, the cover layer may be adapted to exhibit at least one further function in addition to the function of providing encapsulation, in particular a high refractive index, a second optical filter, a scratch-resistant layer, a hydrophilic layer, a hydrophobic layer, a self-cleaning layer, an anti-fog layer, and a conductive layer. Other functions may also be possible.

In a particular embodiment, particularly in a case in which it might not be appropriate to provide the cover layer with the desired further function or in which an extent of the further function as provided by the selected cover layer may not be sufficient, the cover layer may, additionally, at least partially be covered by at least one additional layer at least partially deposited on the cover layer. Preferably, the additional layer may be or exhibit the further function and may, thus, comprise at least one of an anti-reflective layer, a second optical filter, a scratch-resistant layer, a hydrophilic layer, a hydrophobic layer, a self-cleaning layer, an anti-fog layer, or a conductive layer. Herein, the person skilled in the art may be easily capable of selecting and providing the at least one additional layer. However, other embodiments may also be possible.

In a preferred embodiment, the cover layer may partially or fully cover the electrical contacts, which may, especially, be configured to be bondable, such as to one or more leads to an external circuit. Herein, the electrical contacts may be bondable by using wires, such as gold or aluminum wires, wherein the electrical contacts may, preferably, be bondable through the cover layer. In a particular embodiment, a further adhesive layer may be provided at the electrical contacts, wherein the further adhesive layer may, especially, be adapted for bonding. For this purpose, the further adhesive layer may comprise at least one of Ni, Cr, Ti or Pd.

According to the present invention, the detector comprises at least one of the optical sensors as described elsewhere in this document. Thus, the detector may, preferably, be designed for detecting electromagnetic radiation over a considerably wide spectral range, wherein the infrared (IR) spectral range may particularly be preferred. Herein, indium gallium arsenide (InGaAs) may especially, be selected for achieving high sensitivity in the sensor areas for wavelengths up to 2.6 µm, indium arsenide (InAs) for wavelengths up to 3.1 µm, lead sulfide (PbS) for wavelengths up to 3.5 µm, lead selenide (PbSe) for wavelengths up to 5 µm, indium antimonide (InSb) for wavelengths up to 5.5 µm; and mercury cadmium telluride (MCT, HgCdTe) for wavelengths up 16 µm.

Further according to the present invention, the detector comprises an evaluation device which is designed to generate at least one item of information provided by the incident light beam by evaluating the sensor signal. As used herein, the term "evaluation device" generally refers to an arbitrary device designed to generate the items of information. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. Further, the evaluation device may comprise one or more data storage devices. Further, as outlined above, the evaluation device may comprise one or more interfaces, such as one or more wireless interfaces and/or one or more wire-bound interfaces.

As already mentioned above, the detector is a device which is adapted for providing at least one item of information on the incident light beam, such as transmissivity, absorption, emission, reflectivity, and/or a position of at least one object emitting or reflecting the light beam. The detector may be a stationary device or a mobile device. Further, the detector may be a stand-alone device or may form part of another device, such as a computer, a vehicle or any other device. Further, the detector may be a hand-held device. Other embodiments of the detector are feasible.

For further information with respect to the detector for optical detection or any components thereof, reference may be made to WO 2014/097181 A1 and WO 2018/019921 A1, which are incorporated here by reference.

In a further aspect of the present invention, a method for manufacturing an optical detector for an optical detection of an incident light beam is disclosed. The method preferably may be used for manufacturing or producing at least one detector according to the present invention, such as of at least one detector according to one or more of the embodiments disclosed elsewhere in this document in further detail below. Thus, for optional embodiments of the method, reference might be made to the description of the various embodiments of the detector.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method for manufacturing the optical detector according to the present invention comprises the following steps:

a) depositing at least one absorptive layer on a partition of the circuit carrier, the absorptive layer being designed to at least partially absorb the incident light beam, wherein the absorptive layer incorporates infrared absorbing pigments;

b) generating at least one sensor area by depositing a photosensitive material on an at least partially transparent substrate layer, wherein each of the sensor areas is designed to generate at least one sensor signal in a manner dependent on an illumination of the sensor area by the incident light beam;

c) placing the substrate layer carrying the at least one sensor area onto the absorptive layer; and d) providing an evaluation device, wherein the evaluation device is designed to generate at least one item of information by evaluating the at least one sensor signal.

Thus, according to step a), one or more adsorptive layers which incorporate infrared absorbing pigments may, firstly, be deposited on a partition of the circuit carrier, in particular, on the printed circuit board (PCB). As a result, the absorptive layer can, preferably, be or comprise at least one of a resin layer or an adhesive layer as described elsewhere herein in more detail. Independently, at least one sensor area can be generated according to step b) by depositing a photosensitive material on a at substrate layer. Subsequently, the substrate layer which carries the at least one sensor area may be placed according to step c) on the one or more absorptive layers, whereby the absorptive layer may be arranged in the desired position to be capable of at least partially absorbing the incident light beam. Thus, back-reflected light beams may be at least partially absorbed by one of the sensor areas. As a result, no or at least less back-reflected light beams may be capable of deteriorating a measurement result as described above in more detail.

Thereafter, at least two individual electrical contacts may be provided for contacting the corresponding sensor area, wherein the electrical contacts are designed to transmit the sensor signal via the circuit carrier to the evaluation device. Thus, the at least two individual electrical contacts for providing an electrical connection between each of the sensor areas and the evaluation device may be applied, wherein the electrical connection may, preferably, be obtained by applying wire bonds between the individual electrical contacts and corresponding receiving contacts, such as contact pads, which may, preferably, be further placed on the circuit carrier, such as the PCB.

In a particularly preferred embodiment, the absorptive layer may be obtained prior to step a) by adding, such as by at least one of stirring or mixing, the infrared absorbing pigments into at least one of the resin layer or the adhesive layer. Herein, the infrared absorbing pigments may, preferably, be selected from at least one of the pigments as mentioned elsewhere in this document.

In a further preferred embodiment, each of the sensor areas may be directly or indirectly applied to the substrate layer, preferably in a manner that no gap may be left or generated between the substrate layer and each of the sensor areas. For this purpose, the at least one sensor area may be applied by using a deposition method, wherein the deposition method is selected from the group consisting of vacuum evaporation, sputtering, atomic layer deposition, chemical vapor deposition, spray pyrolysis, electrodeposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

As mentioned above, the desired detector is, generally, designed to generate at least one sensor signal in a manner dependent on an illumination of at least one of the sensor areas by an incident light beam. For this purpose, at least two electrical contacts being adapted to electrically contact the at least one sensor area may be further provided. In general, the electrical contacts may be provided before or during any one of the method steps a) to c). In a particularly preferred embodiment, the electrical contacts may be provided by using an evaporated metal layer, such as by known evaporation techniques, wherein the metal layer may, particularly, comprise one or more of silver, aluminum, platinum, magnesium, chromium, titanium, gold, or highly conductive graphene. Alternatively, the electrical contacts may be provided by a galvanic or chemically deposition process, such as electroless Ni, electroless Au, galvanic Ni, or galvanic Au.

In addition, a cover layer may be deposited on the at least one sensor area in a manner that it may, fully or partially, cover the electrical contacts. In this particular embodiment, the electrical contacts are at least partially, preferably fully, covered by the cover layer may, thus, be bonded to at least one external connection by using electrically conductive leads, preferably in form of wires, in particular Au, Al, or Cu wires, wherein the electrically conductive leads may, especially, be bonded to the electrical contacts through the cover layer. By way of example, Au contacts covered by the cover layer may, subsequently, be contacted by wire bonds.

As already described above, at least one additional layer may, further, be deposited on the cover layer or a partition thereof. Herein, the additional layer may be selected to be or comprise at least one of an additional optical filter layer, an anti-reflective layer, an adhesive layer, an encapsulating layer, a scratch-resistant layer, a hydrophilic layer, a hydrophobic layer, a self-cleaning layer, an anti-fog layer, or a conductive layer.

In addition, for further details concerning the manufacturing process for the optical detector reference may be made to the disclosure found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, pMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAP-BGA, UCSP, pBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at https://en.wikipedia.org/wiki/List_of_integrated_circuit_packaging_types or https://en.wikipedia.org/wiki/List_of_integrated_circuit_package_dimensions.

In a further aspect of the present invention, a use of a detector according to the present invention is disclosed. In general, the detector may be used in a detector system, a human-machine interface, an entertainment device, a tracking system and a camera. For further details, reference may be made to WO 2018/193045 A1.

In particular, a use of the detector for a purpose of use is selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, and a security application. In particular, the detector may be used for infra-red detection applications, heat-detection applications, thermometer applications, heat-seeking applications, flame-detection applications, fire-detection applications, smoke-detection applications, temperature sensing applications, spectroscopy applications, or the like. Further, the detector may be used to monitor exhaust gas, to monitor combustion processes, to monitor industrial processes, to monitor chemical processes, to monitor food processing processes, or the like. Further, the detector may be used for temperature control, motion control, exhaust control, gas sensing, gas analytics, motion sensing, chemical sensing, or the like. For further uses of the optical sensor and the detector as disclosed herein, reference may be made to WO 2016/120392 A1 and WO 2018/019921 A1, which are incorporated here by reference. In addition, further fields of applications may still be conceivable.

The above-described optical detector, the method, and the proposed uses have considerable advantages over the prior art. Thus, generally, a simple and, still, efficient detector for sensing at least one of transmissivity, absorption, emission and reflectivity of the at least one object may be provided. Further, the detectors according to the present invention may be particularly sensitive over at least a partition of the IR spectral range, especially, in the MidIR spectral range, i.e. from 1.5 µm to 15 µm, thus providing efficient, reliable and large-area position sensitive devices for the infrared.

As compared to devices known in the art, the detector as proposed herein can, preferably, be arranged in a manner to be capable of effectively avoiding or diminishing cross detection between sensor areas, specifically between adjacent sensor areas, thus, avoiding or at least diminishing deteriorating a measurement based on the at least one sensor signal, in particular, in the infrared spectral range, as far as possible, wherein the optical detector could be manufactured by applying an easy manufacturing process. Herein, the detector can be easily be integrated into a package. Further, the detector as described herein may, preferably, be supplied as a non-bulky hermetic package which may, nevertheless, provide a high degree of protection against possible degradation by external influence, such as humidity and/or oxygen, even at elevated temperatures and/or humidity. Furthermore, the bondability of the electrical contacts even through the cover layer and the non-bulky hermetic package of the at least one sensor area may allow easy integration on a circuit carrier, such as a printed circuit board (PCB). Herein, the materials used for the detector, including the infrared absorbing pigments, may be selected in order to ensure that the at least one sensor area may exhibit a suitable absorption characteristic over a desired spectral range, in particular within a partition of the IR spectral range, especially of the MidIR spectral range.

Summarizing, in the context of the present invention, the following embodiments are regarded as particularly preferred:

Embodiment 1: A detector for an optical detection of an incident light beam, comprising
- a circuit carrier designed to carry at least one layer;
- at least one absorptive layer, the absorptive layer being placed on a partition of the circuit carrier, wherein the absorptive layer is designed to at least partially absorb the incident light beam, wherein the absorptive layer incorporates infrared absorbing pigments;
- a substrate layer, the substrate layer being directly or indirectly adjacent to the absorptive layer, wherein the substrate layer is at least partially transparent with respect to the incident light beam;
- at least one sensor area, each of the sensor areas being placed on the substrate layer, wherein each of the sensor areas is designed to generate at least one sensor signal in a manner dependent on an illumination of the sensor area by the incident light beam; and
- an evaluation device designed to generate at least one item of information by evaluating the at least one sensor signal.

Embodiment 2: The detector according to the preceding embodiment, wherein the absorptive layer is designed to absorb at least one wavelength in at least a partition of the infrared spectral range, the infrared spectral range ranging from 760 nm to 1000 µm.

Embodiment 3: The detector according to the preceding embodiment, wherein the absorptive layer is designed to absorb at least one wavelength in at least a partition of the mid infrared spectral range, the mid infrared spectral range ranging from of 1.5 µm to 15 µm.

Embodiment 4: The detector according to any one of the preceding embodiments, wherein the circuit carrier is designed to mechanically support and electrically connect the detector.

Embodiment 5: The detector according to any one of the preceding embodiments, wherein the circuit carrier is or comprises a printed circuit board (PCB), preferably, a single-sided PCB.

Embodiment 6: The detector according to the preceding embodiment, wherein the printed circuit board is an electrically non-conductive, planar substrate on which at least one sheet of an electrically conductive material is laminated onto the substrate in a manner that electrically conductive structures are etchable into the sheet.

Embodiment 7: The detector according to any one of the preceding embodiments, wherein the absorptive layer is placed on a partition of the surface of the circuit carrier.

Embodiment 8: The detector according to the preceding embodiment, wherein the absorptive layer is placed on a partition of the surface of the printed circuit board (PCB), preferably, a single-sided PCB.

Embodiment 9: The detector according to any one of the preceding embodiments, wherein the absorptive layer is designated to at least partially absorb after it has, at least partially, transmitted at least one of the sensor areas.

Embodiment 10: The detector according to any one of the preceding embodiments, wherein the absorptive layer is designated to absorb at least 50% to 100%, preferably of 80% to 100%, more preferred of 95% to 100%, in particular of 99% to 100%, of the incident light beam.

Embodiment 11: The detector according to the preceding embodiment, wherein the absorptive layer is designated to absorb the incident light beam over at least 50%, more preferred over at least 90%, most preferred over at least 99%, of the sensitive range of the at least one sensor area.

Embodiment 12: The detector according to any one of the preceding embodiments, wherein the absorptive layer is designated to transmit not more than 50%, preferably not more than 20%, more preferred not more than 5%, in particular not more than 1%, of the incident light beam.

Embodiment 13: The detector according to the preceding embodiment, wherein the absorptive layer is designated to transmit not more than 50% of the incident light beam over at least 50%, more preferred over at least 90%, most preferred over at least 99%, of the sensitive range of the at least one sensor area.

Embodiment 14: The detector according to any one of the preceding embodiments, wherein the absorptive layer exhibits a thickness of 100 nm to 350 µm, more preferred of 250 nm to 120 µm, most preferred of 1 µm to 65 µm.

Embodiment 15: The detector according to any one of the preceding embodiments, wherein the absorptive layer is or comprises at least one of a resin layer or an adhesive layer.

Embodiment 16: The detector according to the preceding embodiment, wherein the adhesive layer is designed to assemble the substrate layer and the circuit carrier.

Embodiment 17: The detector according to any one of the two preceding embodiments, wherein the adhesive layer comprises an adhesive substance which is selected from an organic adhesive.

Embodiment 18: The detector according to the preceding embodiment, wherein the organic adhesive is selected from epoxy, polypropylene, polyvinyl chloride, polyvinyl acetate, polyurethane, polysulfide, silyl modified polymer, polyester, silicone, polyol, polyvinyl alcohol, ethylene-vinyl-acetate, cyano-acrylate, polyacrylate, polyethylene, polyvinylpyrrolidone, acrylonitrile, rubber cement, recorcinol glue, or polyamide.

Embodiment 19: The detector according to any one of the three preceding embodiments, wherein the resin layer is selected from at least one of an epoxy, a lacquer, an acrylic resin, a polyurethane, polysiloxane, or an alkyd resin.

Embodiment 20: The detector according to any one of the preceding embodiments, wherein the infrared absorbing pigments are selected from a group consisting of carbon black, graphite, carbon, vantablack, $LaB_6$, copper bronze, copper chromite black, cobalt chromite black, and manganese ferrite black.

Embodiment 21: The detector according to any one of the two preceding embodiments, wherein a concentration of the pigments within the absorptive layer in is 0.1 wt. % to wt. 10%, preferably 0.3 wt. % to 5 wt. %, in particular 0.5 wt. % to 2 wt. %.

Embodiment 22: The detector according to any one of the preceding embodiments, wherein the absorptive layer exhibits a refractive index which is designed for limiting back-reflection at an interface between the absorptive layer and the substrate layer.

Embodiment 23: The detector according to any one of the preceding embodiments, comprising at least two individual absorptive layers, wherein the at least two absorptive layers are arranged in a stack.

Embodiment 24: The detector according to any one of the preceding embodiments, wherein the at least two absorptive layers which are arranged in a stack are selected from at least one of a resin layer or an adhesive layer.

Embodiment 25: The detector according to any one of the preceding embodiments, wherein a material for the substrate layer is selected from glass, quartz, silicon (Si), a transparent conducting oxide (TCO), or a transparent organic polymer.

Embodiment 26: The detector according to the preceding embodiment, wherein the transparent conducting oxide (TCO) is selected from the group consisting of aluminum oxide ($Al_2O_3$), titanium oxide ($TiO_2$), indium tin oxide (ITO), fluorine doped tin oxide ($SnO_2$:F; FTO), aluminum doped zinc oxide (AZO), magnesium oxide (MgO), or a perovskite transparent conducting oxide.

Embodiment 27: The detector according to any one of the preceding embodiments, comprising an array of individual sensor areas.

Embodiment 28: The detector according to the preceding embodiment, wherein adjacent sensor areas are separated by a gap.

Embodiment 29: The detector according to any one of the preceding embodiments, wherein the at least one sensor area is directly or indirectly applied to the substrate layer.

Embodiment 30: The detector according to the preceding embodiment, wherein no gap is left or generated between the substrate layer and each of the sensor areas.

Embodiment 31: The detector according to any one of the two preceding embodiments, wherein the at least one sensor area is applied by using a deposition method.

Embodiment 32: The detector according to the preceding embodiment, wherein the deposition method is selected from the group consisting of chemical bath deposition, vacuum evaporation, sputtering, atomic layer deposition, chemical vapor deposition, spray pyrolysis, anodization, electrodeposition, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading and solution-gas interface techniques.

Embodiment 33: The detector according to any one of the preceding embodiments, wherein the at least one sensor area comprises a photosensitive material selected from a group dye solar cells, photoconductive materials, and quantum dots, wherein the photoconductive materials are particularly preferred.

Embodiment 34: The detector according to any one of the preceding embodiments, wherein the photoconductive material comprises an inorganic photoconductive material, an organic photoconductive material, or a combination thereof.

Embodiment 35: The detector according to the preceding embodiment, wherein the inorganic photoconductive material comprises one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

Embodiment 36: The detector according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 37: The detector according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 38: The detector according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 39: The detector according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 40: The detector according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 41: The detector according to any one of the six preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (CdZnSe), and solid solutions and/or doped variants thereof.

Embodiment 42: The detector according to any one of the seven preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 43: The detector according to any one of the eight preceding embodiments, wherein the metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 44: The detector according to any one of the nine preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 45: The detector according to the preceding embodiment, wherein the at least one sensor area exhibits a thickness from 10 nm to 100 μm, preferably from 100 nm to 10 μm, more preferred from 100 nm to 5 μm.

Embodiment 46: The detector according to any one of the preceding embodiments, further comprising at least two individual electrical contacts contacting the at least one sensor area, wherein the electrical contacts are designed to transmit the sensor signal via the circuit carrier to the evaluation device.

Embodiment 47: The detector according to the preceding embodiment, wherein the wire bonds provide a direct connection between each of the electrical contacts contacting the at least one sensor area and a corresponding receiving contact.

Embodiment 48: The detector according to the preceding embodiment, wherein the receiving contact is further placed on the circuit carrier, preferably on the printed circuit board (PCB).

Embodiment 49: The detector according to any one of the two preceding embodiments, wherein the receiving contact is a contact pad.

Embodiment 50: The detector according to any one of the preceding embodiments, further comprising a cover layer deposited on the at least one sensor area.

Embodiment 51: The detector according to the preceding embodiment, wherein the cover layer is an amorphous layer comprising at least one metal-containing compound.

Embodiment 52: The detector according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Ge, As, Sb, and Te.

Embodiment 53: The detector according to the preceding embodiment, wherein the at least one metal-containing compound comprises a metal selected from the group consisting of Al, Ti, Ta, Mn, Mo, Zr, Hf and W.

Embodiment 54: The detector according to any one of the three preceding embodiments, wherein the at least one metal-containing compound is selected from the group comprising an oxide, a hydroxide, a chalcogenide, a pnictide, a carbide, or a combination thereof.

Embodiment 55: The detector according to the preceding embodiment, wherein the at least one metal-containing compound comprises at least one oxide, at least one hydroxide, or a combination thereof of Al, Ti, Zr or Hf.

Embodiment 56: The detector according to any one of the six preceding embodiments, wherein the cover layer has a thickness of 10 nm to 600 nm, preferably of 20 nm to 200 nm, more preferred of 40 nm to 100 nm, most preferred of 50 to 75 nm.

Embodiment 57: The detector according to any one of the seven preceding embodiments, wherein the cover layer is or comprises an chemical bath deposition, vacuum evaporation, sputtering, atomic layer deposition, chemical vapor deposition, spray pyrolysis, anodization, electrodeposition, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, dip coating, and solution-gas interface techniques.

Embodiment 58: The detector according to any one of the eight preceding embodiments, wherein the cover layer additionally comprises a property of at least one of an optical filter, an anti-reflective layer, an encapsulating layer, an adhesive layer, a scratch-resistant layer, a hydrophilic layer, a hydrophobic layer, a self-cleaning layer, an anti-fog layer, or a conductive layer.

Embodiment 59: The detector according to any one of the nine preceding embodiments, wherein the cover layer directly contacts the at least one sensor area.

Embodiment 60: The detector according to the preceding embodiment, wherein the cover layer fully covers the accessible surface of the at least one sensor area.

Embodiment 61: The detector according to any one of the two preceding embodiments, wherein the cover layer at least partially covers the electrical contacts.

Embodiment 62: The detector according to the preceding embodiment, wherein the electrical contacts are bondable through the cover layer.

Embodiment 63: The detector according to any one of the preceding embodiments, wherein the electrical contacts are bondable, preferably by using wire bonds, in particular Au, Al, or Cu wires.

Embodiment 64: The detector according to any one of the preceding embodiments, wherein the at least two individual electrical contacts are applied at different locations of each of the sensor areas.

Embodiment 65: The detector according to any one of the preceding embodiments, wherein the electrical contacts comprise at least one electrode material selected from the group consisting of Ag, Pt, Mo, Al, Au, and highly conductive graphene.

Embodiment 66: The detector according to the preceding embodiment, wherein a further adhesive layer is provided at the electrical contacts, wherein the further adhesive layer is adapted for bonding.

Embodiment 67: The detector according to the preceding embodiment, wherein the further adhesive layer comprises at least one of Ni, Cr, Ti, or Pd.

Embodiment 68: The detector according to any of the preceding embodiments, wherein the detector is adapted to generate the sensor signal by one or more of measuring an electrical resistance or a conductivity of the at least one sensor area.

Embodiment 69: The detector according to the preceding embodiment, wherein the detector is adapted to generate the sensor signal by performing at least one current-voltage measurement and/or at least one voltage-current-measurement.

Embodiment 70: A method for manufacturing an optical detector for an optical detection of an incident light beam, the method comprising the following steps:
a) depositing at least one absorptive layer on a partition of a circuit carrier, the absorptive layer being designed to at least partially absorb the incident light beam, wherein the absorptive layer incorporates infrared absorbing pigments;
b) generating at least one sensor area by depositing a photosensitive material on an at least partially transparent substrate layer, wherein each of the sensor areas is designed to generate at least one sensor signal in a manner dependent on an illumination of the sensor area by the incident light beam;
c) placing the substrate layer carrying the at least one sensor area onto the absorptive layer; and
d) providing an evaluation device, wherein the evaluation device is designed to generate at least one item of information by evaluating the at least one sensor signal.

Embodiment 71: The method according to the preceding embodiment, wherein the absorptive layer is deposited on a partition of the circuit carrier, in particular, on a printed circuit board (PCB).

Embodiment 72: The method according to any one of the preceding embodiments referring to the method, wherein the substrate layer which carries the at least one sensor area is placed on the absorptive layer by directly or indirectly applying the substrate layer to the absorptive layer.

Embodiment 73: The method according to any one of the preceding embodiments referring to the method, wherein the absorptive layer is obtained prior to step a) by adding the infrared absorbing pigments into at least one of a resin layer or an adhesive layer.

Embodiment 74: The method according to any one of the preceding embodiments referring to the method, wherein the infrared absorbing pigments are selected from a group consisting of carbon black, graphite, carbon, vantablack, $LaB_6$, copper bronze, copper chromite black, cobalt chromite black, and manganese ferrite black.

Embodiment 75: The method according to the preceding embodiment, wherein the absorptive layer is obtained by adding 0.1 wt. % to wt. 10%, preferably 0.3 wt. % to 5 wt. %, in particular 0.5 wt. % to 2 wt. %, of infrared absorbing pigments into at least one of the resin layer or the adhesive layer.

Embodiment 76: The method according to any one of the preceding embodiments referring to the method, further comprising applying the at least one sensor area directly or indirectly to the substrate layer.

Embodiment 77: The method according to the preceding embodiment, wherein no gap is left or generated between the substrate layer and the at least one sensor area.

Embodiment 78: The method according to any one of the two preceding embodiments, wherein the at least one sensor area is applied by using a deposition method, wherein the deposition method is selected from the group consisting of chemical bath deposition, vacuum evaporation, sputtering, atomic layer deposition, chemical vapor deposition, spray pyrolysis, electro-deposition, anodization, electro-conversion, electro-less dip growth, successive ionic adsorption and reaction, molecular beam epitaxy, molecular vapor phase epitaxy, liquid phase epitaxy, inkjet printing, gravure printing, flexo printing, screen printing, stencil printing, slot die coating, doctor blading, and solution-gas interface techniques.

Embodiment 79: The method according to any one of the preceding embodiments referring to the method, wherein the photosensitive material is selected from a group consisting of dye solar cells, photoconductive materials, and quantum dots, wherein the photoconductive materials are particularly preferred.

Embodiment 80: The method according to any one of the preceding embodiments referring to the method, wherein at least two individual electrical contacts for contacting the at least one sensor are provided, the electrical contacts are designed to transmit the sensor signal via the circuit carrier to the evaluation device.

Embodiment 81: The method according to the preceding embodiment, wherein the electrical contacts are bonded to at least one external connection by using electrically conductive leads, preferably in form of wire bonds, in particular Au, Al, or Cu wires.

Embodiment 82: The method according to the preceding embodiment, wherein the electrical connection is obtained by applying the wire bonds between the individual electrical contacts and corresponding receiving contacts.

Embodiment 83: The method according to the preceding embodiment, wherein the receiving contacts are contact pads which are, preferably, further placed on the circuit carrier, in particular, on the printed circuit board (PCB).

Embodiment 84: The method according to any one of the preceding embodiments referring to the method, wherein a cover layer is generated, the cover layer at least partially, preferably fully, covering the at least one sensor area.

Embodiment 85: The method according to the preceding embodiment, wherein the electrically conductive leads are bonded to the electrical contacts through the cover layer.

Embodiment 86: The use of a detector according to any one of the preceding embodiments referring to a detector, for a purpose of use, selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, and a security application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiment. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 1:
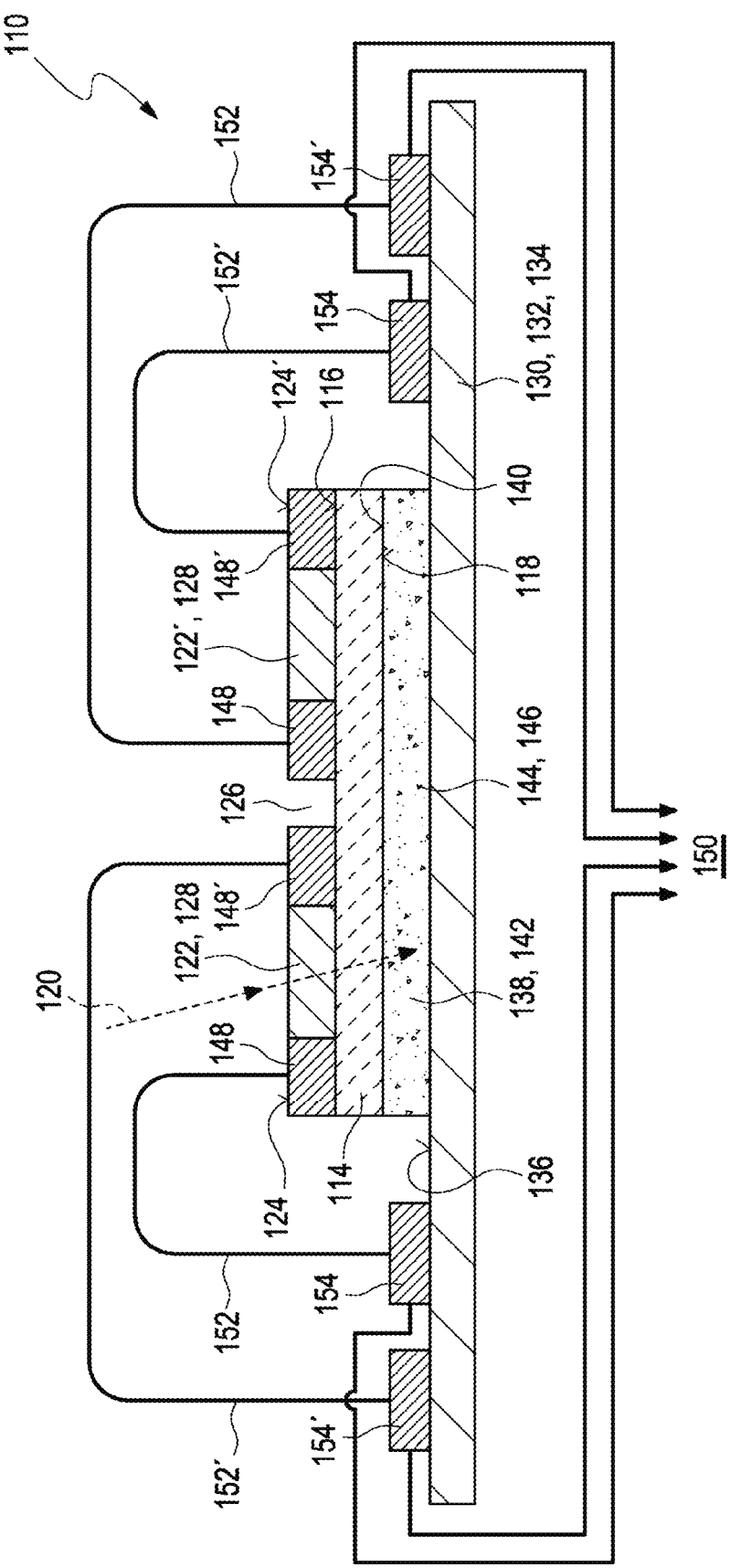
FIG. 1 illustrates an exemplary embodiment of an optical detector according to the present invention.

FIG. 1 illustrates, in a highly schematic fashion, an exemplary embodiment of an optical detector 110 according to the present invention. Herein, the detector 110 is adapted for optical detection, in particular, for detecting at least one wavelength in at least a partition of a spectral range, wherein the desired partition of the spectral range may, preferably, be selected from the infrared (IR) spectral range, i.e. the spectral range of 760 nm to 1000 µm.

Specifically, the detector may be designed for sensing at least one optically conceivable property of at least one object 112. In particular, the optically conceivable property determinable by the detector 110 may be selected from at least one of an optical property and/or a geometric property of the object 112. By way of example, the optical property may, preferably, be selected from a transmissivity, absorption, emission, and/or reflectivity of the object 112, while the geometric property may, in particular, refer to a position of the object 112 in relation to the detector 110. For sake of simplicity, the object 112 is only schematically depicted in FIG. 4, however, the object 112 may also assumed to be present in the embodiments according to FIG. 1.

The detector 110 comprises at least one substrate layer 114 having at least a first surface 116 and a second surface 118, wherein the second surface 118 is located oppositely with respect to the first surface 116. Herein, the first surface 116 and/or the second surface 118 of the substrate layer 114 may, as depicted in FIG. 1, preferably be a flat surface. However, in an alternative embodiment (not depicted here), at least one of the first surface 116 or of the second surface 118 of the substrate layer 114 may exhibit a curved surface, wherein the curved surface refers to an area which may deviate from being a flat plane. Herein, the curved surface may, especially, be designed to correct aberrations an incident light beam 120 may experience on its path through the detector 110. In particular, the curved surface may be is selected from a convex or a concave surface. However, other kinds of curved surfaces may also be conceivable.

For the purposes of the present invention, the incident light beam 120 may impinge on a sensor layer which may indirectly or, preferably, directly be applied to the second surface 118 of the substrate layer 114, preferentially that no gap may remain between the substrate layer 114 and the sensor layer. Herein, the sensor layer may (not depicted here) be exactly a single continuous sensor layer. Preferably, however, the optical detector may comprise at least two individual sensor areas 122, 122', preferably an array of individual sensor areas, whose top surfaces 124, 124' may, in particular, be arranged in form of a sensor layer, wherein adjacent sensor areas 124, 124' may be separated with respect to each other by a gap 126. As a result, multi pixel applications may be feasible, according to which the incident light beam 120 may impinge only on a single individual sensor area 122 which only, dependent on an illumination of the sensor area 122 by the incident light beam 120, generates the corresponding sensor signal. In this fashion, a differentiation between various incident light beams 120 with respect to at least one property of the incident light beam may be made, specifically, with respect to a location of impingement of the light beam 120 or with regard to a physical property, including but not limited to a color, or a polarization.

According to the present invention, each of the sensor areas 122, 122' comprises at least one photosensitive material 128. In a particularly preferred embodiment, the photosensitive material 128 may comprise a photoconductive material, preferentially, at least one chalcogenide material, in particular, selected from the group consisting of lead sulfide (PbS) lead selenide (PbSe), lead telluride (PbTe), cadmium telluride (CdTe), or indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), and copper zinc tin sulfide (CZTS). However, other chalcogenides or other kinds of photoconductive materials may also be employed. Herein, indium gallium arsenide (InGaAs) may especially, be selected for achieving high sensitivity in the sensor areas for wavelengths for wavelengths up to 2.6 μm, indium arsenide (InAs) for wavelengths up to 3.1 μm, lead sulfide (PbS) for wavelengths up to 3.5 μm, lead selenide (PbSe) for wavelengths up to 5 μm, indium antimonide (InSb) for wavelengths up to 5.5 μm; and mercury cadmium telluride (MCT, HgCdTe) for wavelengths up 16 μm.

Preferably, the sensor areas 122, 122' may be deposited on the substrate layer 114 by using a deposition method, advantageously, by using a bath deposition process, which may easily allow generating a thickness from 1 nm to 100 μm, preferably from 10 nm to 10 μm, more preferred from 100 nm to 1 μm. However, alternative arrangements of the sensor areas 122, 122' or other deposition methods for generating the sensor areas 122, 122' may also be feasible. Further, the detector 110 comprises a circuit carrier 130. As generally used, the circuit carrier 130 refers to a platform being designed to mechanically support and electrically connect electronical, electrical, and/or optical elements, such as the detector 110 or a partition thereof. In a particularly preferred embodiment of the present invention, the circuit carrier 130 may be or comprise a printed circuit board (PCB) 132. As schematically illustrated in FIG. 1, the printed circuit board 132 comprises only a single sheet and may, thus, be denominated as a single-sided PCB 134, However, printed circuit boards comprising more than only a single sheet, such as a double-sided PCB or a multi-layer PCB, wherein the different sheets may be connected with each other by using so-called "vias", may also be applicable. However, other types of circuit carriers 130 may also be applicable. As general, the electronical, electrical, and/or optical elements may be placed on a surface 136 of the printed circuit board 132, such as by soldering, welding, or depositing, or, additionally or as an alternative, by embedding into the circuit carrier 130, such as by placing into seats designated in the circuit carrier 130 for this purpose and/or by removing a partition of the circuit carrier 130.

Figure 2:
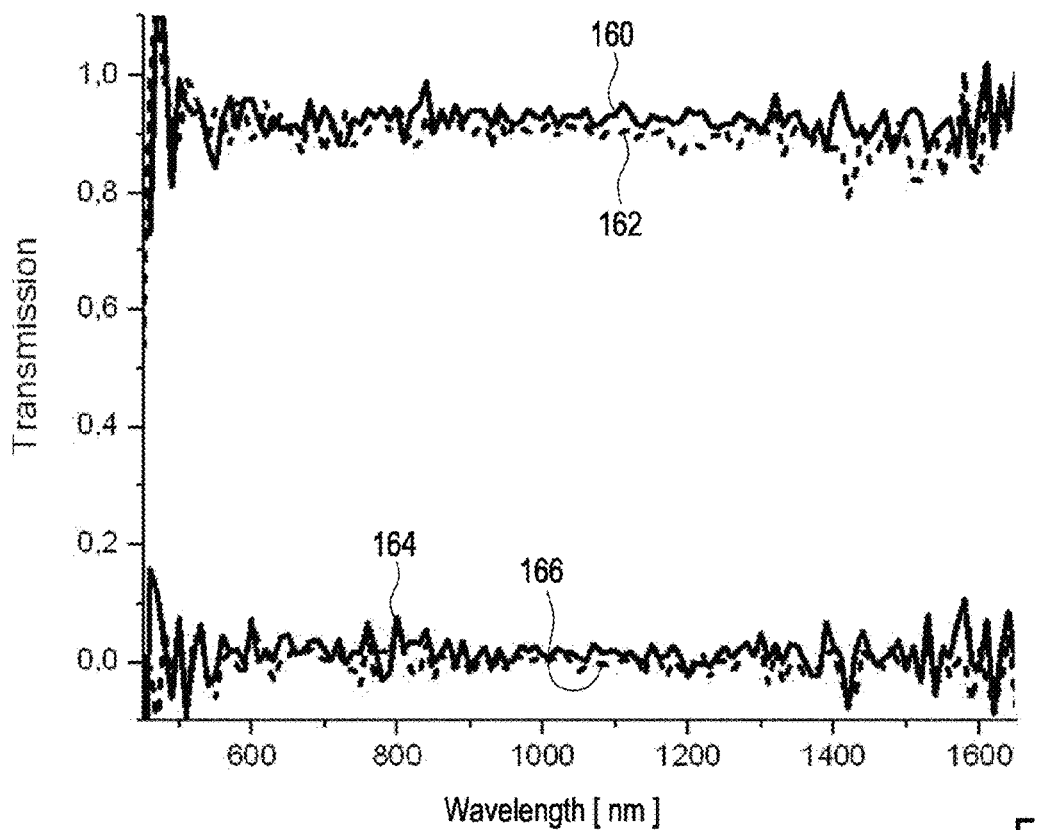
FIG. 2 illustrates results of transmission measurements using the exemplary embodiment of the optical detector according to FIG. 1.

Further, the detector 110 according to the present invention comprises an absorptive layer 138 which is, thus, placed on a partition of the circuit carrier 130, in particular on a partition of the surface 136 of the printed circuit board 132. Herein, the absorptive layer 138 is designed to at least partially, preferably completely, absorb the incident light beam 120, in particular, in a manner that the incident light beam 120 may not be reflected back into the sensor areas 122, 122' after the incident light beam 120 has, at least partially, preferably completely, transmitted the sensor areas 122, 122' before. As indicated above, the term "at least partially absorb" may be expressed by a low grade of transmission of the absorptive layer 138 of 0% to 50%, preferably of 0% to 20%, more preferred of 0% to 5%, in particular of 0% to 1%, as illustrated in FIG. 2 in more detail. In accordance with the present invention, the absorptive layer 138 may, thus, be designed to exhibit this low grade of transmission over at least a partition of the infrared spectral range of wavelengths from 760 nm to 1000 μm, preferably, at least over the near infrared (NIR) spectral range of 760 nm to 1.4 μm or the far infrared (FIR) spectral range of 15 μm to 1000 μm as, however, more preferred over at least the mid infrared (MIR) from 1.5 μm to 15 μm. In particular, the absorptive layer 138 may be designed to exhibit this low grade of transmission over at least a partition, preferably of at least 50%, more preferred of at least 90%, most preferred of at least 99%, of the sensitive range of the at least one sensor area as described below in more detail. As a result, the absorptive layer 138 may, thus, diminish or, preferably, avoid that back-reflected light beams may be absorbed by one of the sensor areas 122, 122'. Consequently, less or, preferably, no back-reflected light beams may occur which could be capable of deteriorating a measurement result, specifically by reaching a different sensor area 122' as the sensor area 122 which had been impinged by the incident light beam 120 before. As a result, each incident light beam 120 may, thus be correctly assigned to the corresponding sensor area 122 and, therefore, only contributes to the correct sensor signal as desired.

Depending on the selected material, the absorptive layer 138 may exhibit a thickness of 100 nm to 350 μm, more preferred of 250 nm to 120 μm, most preferred of 1 μm to 65 μm, in order to provide a close and stable connection to both the substrate layer 114 and the circuit carrier 130.

In particular, the absorptive layer 138 may comprise an adhesive layer 142 which may, in particular, comprise at least one of an organic adhesive, specifically selected from epoxy, polypropylene, polyvinyl chloride, polyvinyl acetate, polyurethane, polysulfide, silyl modified polymer, polyester, silicone, polyol, polyvinyl alcohol, ethylene-vinyl-acetate, cyanoacrylate, polyacrylate, polyethylene, polyvinylpyrrolidone, acrylonitrile, rubber cement, recorcinol glue, polyamide, or a resin layer (not depicted here) which may, preferably, comprise an epoxy, a lacquer, an acrylic resin, a polyurethane, polysiloxane, an alkyd resin, or the like.

According to the present invention the absorptive layer 138 incorporates infrared absorbing pigments 144, which are designed of contributing to the desired grade of absorption as describe above. As particularly preferred, the infrared absorbing pigments 144 may be selected from a group consisting of carbon black 146, graphite, carbon, vantablack, $LaB_6$, copper bronze, copper chromite black, cobalt chromite black, and manganese ferrite black. Herein, carbon black 146 may, particularly, be preferred since it is an easily available and low-cost material. However, further kinds of infrared absorbing pigments reference may also be used. Depending on the infrared absorbing pigments 144 which had been selected for the absorptive layer 138, a concentration of the pigments within the absorptive layer 138, i.e. in the organic adhesive and/or the resin as, respectively, comprised by the absorptive layer 138, may, preferably, be selected of 0.1 wt. % to 10 wt. %, preferably of 0.3 wt. % to 5 wt. %, in particular 0.5 wt. % to 2 wt. %.

In further embodiments, the absorptive layer 138 may, alternatively or in addition, exhibit one or more chemical or physical properties which may prove to be advantageous for the optical sensor 110. Thus, in a preferred embodiment, the absorptive layer 138 may have a refractive index which can, in particular, be adapted for limiting a back-reflection at a surface 140 the absorptive layer 138, wherein the surface 140 constitutes an interface to the substrate layer 114. As a result, less or, preferably, no light beams 120 may be back-reflected to the sensor areas 122, 122' where they might be capable of deteriorating a measurement result. Further properties of the absorptive layer 138 may also be conceivable.

Thus, as already indicated above, in particular contrast to WO 2018/193045 A1, wherein a reflective layer, specifically a reflective gold coating, at the same location as the absorptive layer according to the present invention was disclosed in order to increase the back-reflection in an economic manner, the present application attempts to avoid back-reflection as far as possible.

Whereas in the embodiments as disclosed in WO 2018/193045 A1 increasing back-reflection may, especially, be advantageous for optical detectors comprising a single sensor layer (single pixel applications) in order to increase a signal-to-noise ratio by redirecting the incident light beam 120 to the sensor layer, decreasing back-reflection in accordance to the present invention may be advantageous for the optical detectors 110 which comprise at least two individual sensor areas 122, 122' (multi pixel applications), in particular to avoid or, preferably, diminish cross detection between sensor the areas 122, 122'.

Preferably, the substrate layer 114 is at least partially transparent with respect to the incident light beam 120. For this purpose, the substrate layer 114 may comprise a material which may, preferably, be selected from glass, quartz, silicon (Si), a transparent organic polymer, or a transparent conducting oxide (TCO), which can, in particular, be selected from the group consisting of aluminum oxide ($Al_2O_3$), titanium oxide ($TiO_2$), indium tin oxide (ITO), fluorine doped tin oxide ($SnO_2$:F; FTO), aluminum doped zinc oxide (AZO), magnesium oxide (MgO), or a perovskite transparent conducting oxide. However, depending on the desired wavelength range of the detector 110, other kinds of materials may also be feasible.

Further, each of the sensor areas 122, 122' may, preferably, comprise electrical contacts 148, 148' which are designed to transmit the at least one sensor signal as generated in the corresponding sensor area 122, 122' directly or indirectly to an evaluation device 150 (not depicted here). Preferably, the electrical contacts 148, 148' may comprise at least one electrode material selected from a group consisting of Ag, Pt, Mo, Al, Au, and highly conductive graphene. As illustrated in FIG. 1, the electrical contacts 148, 148' may, further, be bonded using bond wires or bonding wires 152, 152', wherein the bonding wires 152, 152' may, in particular, be or comprise Au, Al, or Cu wires. Particularly in order to support the bonding between the bonding wires 152, 152' and the electrode material of the electrical contacts 148, 148', a further adhesive layer (not depicted here) may, additionally, be provided at the electrical contacts 148, 148', wherein the further adhesive layer may comprise at least one of Ni, Cr, Ti or Pd. However, other kinds of bonding wires and/or further adhesive layers may also be feasible. As further depicted in FIG. 1, the bonding wires 152, 152' carrying the sensor signal may be guided to contact pads 154, 154' which are located on the surface 136 of the circuit carrier 130 and which comprise an electrically conducting material, wherefrom the sensor signal may, further, be guided to the evaluation device 150 in a direct or an indirect manner. This arrangement may allow an easy handling and contacting of the detector 110, preferably, by automatically picking and placing the substrate layer 114 carrying the sensor areas 122, 122' and the electrical contacts 148, 148' on a selected location on the circuit carrier 130 and, subsequently, by providing the bonding wires 152, 152'.

Thus, the electrical contacts 148, 148' may be designed to transmit the sensor signal as generated by at least one of the sensor areas 122, 122' to the evaluation device 150. Alternatively, the sensor signal may be transmitted from at least one of the sensor areas 122, 122' to the evaluation device 150 in a wireless fashion. Consequently, the resulting sensor signal as provided by at least one of the sensor areas 122, 122' upon impingement by the incident light beam 120 depends on properties of the photosensitive material 128 as comprised by the sensor areas 122, 122'. The evaluation device 150 is, generally, designed to generate at least one item of information provided by both the incident light beam 120 about one or more optically conceivable properties of at least one object 112 by evaluating the sensor signal. For this purpose, the evaluation device 150 may comprise one or more electronic devices and/or one or more software components, in order to evaluate the sensor signals. Thus, the evaluation device 150 may be adapted to determine the at least one item of information by comparing more than one sensor signals as acquired by at least one of the sensor areas 122, 122'.

Generally, the evaluation device 150 may be part of a data processing device and/or may comprise one or more data processing devices. The evaluation device 150 may be fully or partially integrated into the circuit carrier 130 and/or may fully or partially be embodied as a separate device which may be electrically connected in a wireless or wire-bound fashion to the sensor areas 122, 122'. The evaluation device 150 may further comprise one or more additional components, such as one or more electronic hardware components and/or one or more software components, such as one or more measurement units and/or one or more evaluation units and/or one or more controlling units (not depicted here).

According to further exemplary embodiments of the detector 110 (not illustrated here), the detector 110 may, further, comprise an optional cover layer which may, preferably, be directly deposited on the sensor areas 122, 122'. Herein, the cover layer may, especially, be an amorphous layer comprising at least one metal-containing compound, wherein the metal-containing compound may, advantageously, be selected from an oxide, a hydroxide, a chalcogenide, a pnictide, or a carbide of Al, Ti, Ta, Mn, Mo, Zr, Hf, or W or a combination thereof. Herein, the cover layer, which may, particularly, exhibit a thickness of 10 nm to 600 nm, preferably of 20 nm to 200 nm, may be or comprise an atomic deposition layer. Alternatively, the cover layer may be generated by employing a chemical vapor deposition (CVD) process, such as a plasma-enhanced chemical vapor deposition (PECVD) process. Further, other deposition methods, such as spin coating or ink-jet printing, may also be applied. The cover layer may, in particular, be used to avoid as far as possible a degradation of the sensor areas 122, 122' by external influence, such as by humidity and/or by oxygen as comprised in a surrounding atmosphere. Thus, the cover layer may provide an encapsulation, preferably, a hermetic packaging, of the sensor areas 122, 122', in particular, by fully covering any accessible surfaces of the sensor areas 122, 122'. Herein, the cover layer may, additionally, cover the electrical contacts 148, 148'. Further, the electrical contacts 148, 148' may be bonded through the cover layer, whereby, preferably, the bonding wires 152, 152' may be used.

FIG. 2 shows experimental results with respect to a transmission of an incident light beam 120 which impinges on an optical detector. Herein, a first curve 160 shows a dependence of the transmission in an optical sensor which only comprises a glass layer serving as the substrate layer 114 with respect to the wavelength of the incident light beam 120. Similarly, a second curve 162 shows the wavelength dependence of the transmission in an optical detector which, additionally, comprises an adhesive layer only having an organic adhesive without infrared absorbing pigments. Further, a third curve 164 shows the wavelength dependence of the transmission in the optical detector 110 which comprises a first variety of carbon black 146 as the infrared absorbing pigments 144 added to the organic adhesive of the absorptive layer 138, specifically by mixing the selected infrared absorbing pigments 144 into a phase comprising the organic adhesive and, subsequently, stirring the corresponding mixture. Similarly, a fourth curve 166 shows the wavelength dependence of the transmission in the optical detector 110 which, instead, comprises a different variety of carbon black 146 as the infrared absorbing pigments 144 added to the organic adhesive of the absorptive layer 138. Compared to the first and second curves 160, 162, the third and fourth curves 164, 166 demonstrate that the transmission is significantly lower in the optical detector 110 according to the present invention which comprises carbon black 146 as the infrared absorbing pigments 144 within the organic adhesive of the absorptive layer 138.

Figure 3:
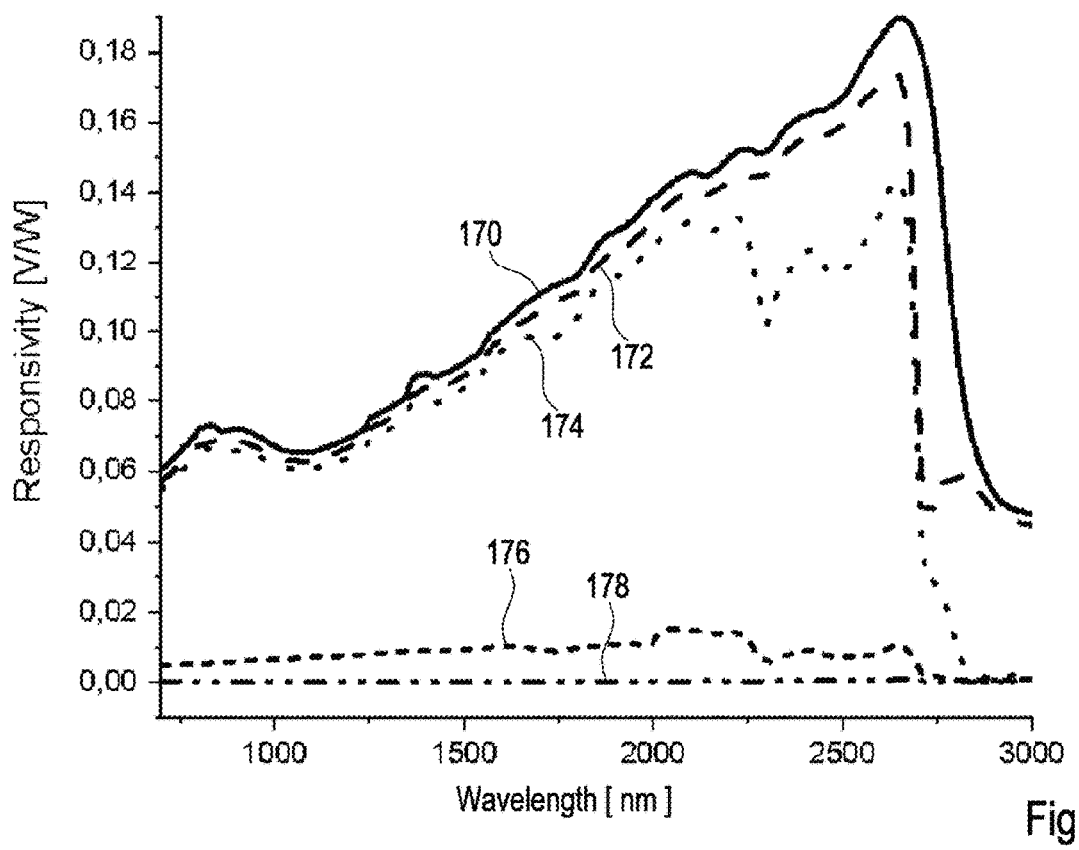
FIG. 3 illustrates results of responsivity measurements using the exemplary embodiment of the optical detector according to FIG. 1.

Further, FIG. 3 shows experimental results with respect to a responsivity of an optical detector with regard to an incident light beam 120 having a particular wavelength. Herein, a first curve 170 shows a dependence of the responsivity of a single sensor area 122 which comprises PbS as the photosensitive material 128. Further, a second curve 172 shows the wavelength dependence of the responsivity in an optical sensor in which the single sensor area 122 is placed on a glass layer as the substrate layer 114. Further, a third curve 174 shows the wavelength dependence of the responsivity in an optical sensor which additionally, comprises an adhesive layer only having an organic adhesive without infrared absorbing pigments 144. Further, a fourth curve 176 shows the wavelength dependence of the responsivity in the optical sensor 110 which comprises a first variety of carbon black 146 as the infrared absorbing pigments 144 added to the organic adhesive of the absorptive layer 138. Similarly, a fifth curve 178 shows the wavelength dependence of the responsivity in the optical sensor 110 which, instead, comprises a different variety of carbon black 146 as the infrared absorbing pigments 144 added to the organic adhesive of the absorptive layer 138. Compared to the first, second and third curves 170, 172, 174 the fourth and fifth curves 176, 178 demonstrate that the responsivity is significantly lower in in the optical detector 110 according to the present invention which comprises carbon black 146 as the infrared absorbing pigments 144 within the organic adhesive of the absorptive layer 138.

Figure 4:
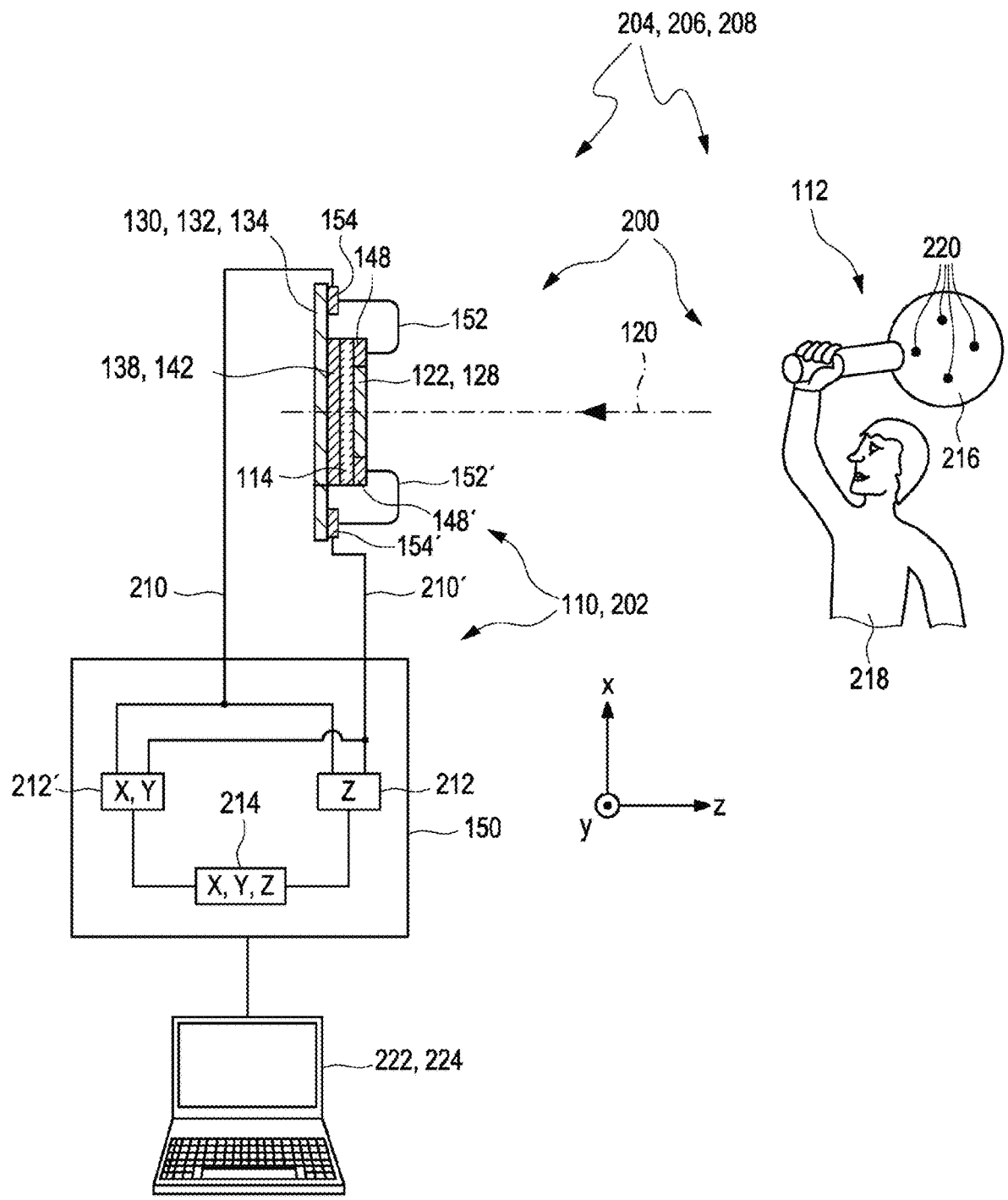
FIG. 4 shows an exemplary embodiment of a detector system comprising the exemplary embodiment of the optical detector according to FIG. 1.

As a further example, FIG. 4 shows an exemplary embodiment of a detector system 200, comprising the at least one detector 110 which is placed on the circuit carrier 130, in particular on the printed circuit board (PCB) 132, more particular on the single-sided PCB 134, as described above. Especially, the detector 110 as shown in FIG. 1 may also be feasible for this purpose. Accordingly, the detector 110 has the substrate layer 114 having at the least a first surface 116 and the second surface 118, wherein the second surface 118 is located oppositely with respect to the first surface 116. In contrast to the embodiment of FIG. 1, the substrate layer 114 carries only a single sensor area 122 comprising the photosensitive material 128 which is deposited on the second surface 118 of the substrate layer 114. For the purposes of the present invention, the sensor area 122 is designed to generate at least one sensor signal in a manner dependent on an illumination of the sensor area 122 by the incident light beam 120.

Further, the detector 110 comprises the at least one absorptive layer 138 which is placed between the circuit carrier 130, in particular the printed circuit board 132, more particular the single-sided PCB 134, and which incorporates infrared absorbing pigments 144 in order to at least partially absorb the incident light beam 120 as described above. In particular, the detector 110 may be employed to determine at least one optical property of the object 112, such as selected from the transmissivity, absorption, emission, and/or reflectivity of the object 112. In addition, the sensor area 122 may be protected by a cover layer (not depicted here) as described above.

The detector 110 may be employed as a camera 202, specifically for 3D imaging, which may be made for acquiring images and/or image sequences, such as digital video clips. Further, FIG. 4 shows an exemplary embodiment of a human-machine interface 204, which comprises the at least one detector 110 and/or the at least one detector system 200, and, further, an exemplary embodiment of an entertainment device 206 comprising the human-machine interface 204. FIG. 4 further shows an embodiment of a tracking system 208 adapted for tracking a position of at least one object 112, which comprises the detector 110 and/or the detector system 200.

Further, the sensor signal as generated by the sensor area 122 is provided to the evaluation device 150 in order to generate the at least one item of information about the object 112 as provided by both the incident light beam 120 by evaluating the sensor signal. For this purpose, the sensor signal is guided via the electrodes 148, 148', the wiring bonds 152, 152', the contact pads 154, 154' as located on the circuit carrier 130, and signal leads 210, 210' to the evaluation device 150. Herein, the signal leads 210, 210' may be wireless interfaces and/or wire-bound interfaces. Further, the signal leads 210, 210' may comprise one or more drivers and/or one or more measurement devices for modifying sensor signals. The evaluation device 150 may fully or partially be integrated into one or more components of the detector 110. The evaluation device 150 may also be enclosed into a housing comprising the detector 110 and/or into a separate housing. The evaluation device 150 may comprise one or more electronic devices and/or one or more software components, in order to evaluate the sensor signals, such as by a longitudinal evaluation unit 212 (denoted by "z") and/or a transversal evaluation unit 212' (denoted by "xy").

By combining results derived by these evolution units 212, 212', position information 214, preferably a three-dimensional position information, may be generated (denoted by "x, y, z"). However, as mentioned above, at least one optical property of the object 112, such as selected from the transmissivity, absorption, emission, and/or reflectivity of the object 112, may, preferably, be determined by using the evaluation device 150.

In the exemplary embodiment as shown in FIG. 4, the object 112 to be detected, as an example, may be designed as an article of sports equipment and/or may form a control element 216, the position and/or orientation of which may be manipulated by a user 218. Thus, generally, in the embodiment shown in FIG. 4 or in any other embodiment of the detector system 200, the human-machine interface 204, the entertainment device 206 or the tracking system 208, the object 112 itself may be part of the named devices and, specifically, may comprise the at least one control element 216, specifically, wherein the at least one control element 216 has one or more beacon devices 220, wherein a position and/or orientation of the control element 216 preferably may be manipulated by user 218. As an example, the object 112 may be or may comprise one or more of a bat, a racket, a club or any other article of sports equipment and/or fake sports equipment. Other types of objects 112 are possible. Further, the user 218 may be considered as the object 112, the position of which shall be detected. As an example, the user 218 may carry one or more of the beacon devices 220 attached directly or indirectly to his or her body.

The determination of a position of the object 112 and/or a part thereof by using the detector 110 and/or the detector system 200 may be used for providing a human-machine interface 204, in order to provide at least one item of information to a machine 222. In the embodiments schematically depicted in FIG. 4, the machine 222 may be or may comprise at least one computer and/or a computer system comprising the data processing device. Other embodiments are feasible. The evaluation device 150 may be a computer and/or may comprise a computer and/or may fully or partially be embodied as a separate device and/or may fully or partially be integrated into the machine 222, particularly the computer. The same holds true for a track controller 224 of the tracking system 208, which may fully or partially form a part of the evaluation device 150 and/or the machine 222.

Similarly, as outlined above, the human-machine interface 204 may form part of the entertainment device 206. Thus, by means of the user 218 functioning as the object 112 and/or by means of the user 218 handling the object 112 and/or the control element 216 functioning as the object 112, the user 218 may input at least one item of information, such as at least one control command, into the machine 222, particularly the computer, thereby varying the entertainment function, such as controlling the course of a computer game.

As outlined above, the detector 110 may have a straight beam path or a tilted beam path, an angulated beam path, a branched beam path, a deflected or split beam path or other types of beam paths. Further, the incident light beam 120 may propagate along each beam path or partial beam path once or repeatedly, unidirectionally or bidirectionally.

LIST OF REFERENCE NUMBERS 110 detector
112 object
114 substrate layer
116 first surface
118 second surface
120 incident light beam
122, 122' sensor area
124 surface
126 gap
128 photosensitive material
130 circuit carrier
132 printed circuit board (PCB)
134 single-sided PCB
136 surface
138 absorptive layer
140 surface
142 adhesive layer
144 infrared absorbing pigments
146 carbon black
148, 148' electrical contract
150 evaluation device
152, 152' bonding wire
154, 154' contact pad
160 first curve
162 second curve
164 third curve
166 fourth curve
170 first curve
172 second curve
174 third curve
176 fourth curve
178 fifth curve
200 detector system
202 camera
204 human-machine interface
206 entertainment device
208 tracking system
210, 210' signal leads
212, 212' longitudinal evaluation unit, transversal evaluation unit
214 position information
216 control element
218 user
220 beacon device
222 machine
224 track controller

The invention claimed is:

1. A detector (110) for an optical detection of an incident light beam (120), comprising
a circuit carrier (130) designed to carry at least one layer;
at least one absorptive layer (138), the absorptive layer (138) being placed on a partition of the circuit carrier (130), wherein the absorptive layer (138) is designed to at least partially absorb the incident light beam (120), wherein the absorptive layer (138) incorporates infrared absorbing pigments (144), wherein the absorptive layer (138) is or comprises an adhesive layer (142), wherein the adhesive layer (142) comprises an adhesive substance which is an organic adhesive, wherein the organic adhesive is selected from the group consisting of polypropylene, polyvinyl chloride, polyvinyl acetate, polysulfide, silyl modified polymer, polyester, silicone, polyol, polyvinyl alcohol, ethylene-vinyl-acetate, cyano-acrylate, polyacrylate, polyethylene, polyvinylpyrrolidone, acrylonitrile, rubber cement, recorcinol glue, and polyamide;
a substrate layer (114), the substrate layer (114) being directly or indirectly adjacent to the absorptive layer (138), wherein the substrate layer (114) wherein the substrate layer (114) is at least partially transparent with respect to the incident light beam (120);
at least one sensor area (122, 122'), the at least one sensor area (122, 122') being placed on the substrate layer (114), wherein the at least one sensor area (122, 122') is designed to generate at least one sensor signal in a manner dependent on an illumination of the at least one sensor area (122, 122') by the incident light beam (120), wherein the at least one sensor area comprises at least two individual sensor areas (122, 122'), wherein adjacent sensor areas (122, 122') are separated with respect to each other by a gap (126); and an evaluation device (150) designed to generate at least one item of information by evaluating the at least one sensor signal.

2. The detector (110) according to claim 1, wherein the absorptive layer (138) is designed to at least partially absorb at least one wavelength in at least a partition of the infrared spectral range, the infrared spectral range ranging from 760 nm to 1000 µm.

3. The detector (110) according to claim 1, wherein the infrared absorbing pigments (144) are selected from the group consisting of carbon black (146), graphite, carbon, vantablack, $LaB_6$, copper bronze, copper chromite black, cobalt chromite black, and manganese ferrite black.

4. The detector (110) according to claim 1, wherein a concentration of the pigments within the absorptive layer (138) is 0.1 wt. % to 10 wt. %.

5. The detector (110) according to claim 1, comprising at least two individual absorptive layers (138), wherein the at least two absorptive layers (138) are arranged in a stack.

6. The detector (110) according to claim 1, wherein the absorptive layer (138) exhibits a refractive index which is designed for limiting back-reflection at an interface between the absorptive layer (138) and the substrate layer (114).

7. The detector (110) according to claim 1, wherein the at least one sensor area (122, 122') comprises a photosensitive material (128), wherein the photosensitive material (128) is an inorganic photoconductive material comprising one or more of selenium, tellurium, a selenium-tellurium alloy, a metal oxide, a group IV element or compound, a III-V compound, a II-VI compound, a chalcogenide, a pnictogenide, a halide, and solid solutions and/or doped variants thereof.

8. The detector (110) according to claim 7, wherein the photosensitive material (128) chalcogenide is selected from the group consisting of lead sulfide (PbS), lead selenide (PbSe), indium antimonide (InSb), mercury cadmium telluride (MCT, HgCdTe), indium gallium arsenide (InGaAs), indium arsenide (InAs), and a solid solution and/or a doped variant thereof.

9. The detector (110) according to claim 1, further comprising at least two individual electrical contacts (148, 148') contacting the sensor area (122, 122'), wherein the electrical contacts (148, 148') are designed to transmit the sensor signal via the circuit carrier (130) to the evaluation device (150).

10. A method of using the optical detector (110) according to claim 1, the method comprising using the optical detector (110) for a purpose selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, and a security application.

11. A method for manufacturing a detector (110) for an optical detection of an incident light beam (120), the method comprising the following steps:
a) depositing at least one absorptive layer (138) on a partition of a circuit carrier (130), the absorptive layer (138) being designed to at least partially absorb the incident light beam (120), wherein the absorptive layer (138) incorporates infrared absorbing pigments (144), wherein the absorptive layer (138) is or comprises an adhesive layer (142), wherein the adhesive layer (142) comprises an adhesive substance which is an organic adhesive, wherein the organic adhesive is selected from the group consisting of polypropylene, polyvinyl chloride, polyvinyl acetate, polysulfide, silyl modified polymer, polyester, silicone, polyol, polyvinyl alcohol, ethylene-vinyl-acetate, cyano-acrylate, polyacrylate, polyethylene, polyvinylpyrrolidone, acrylonitrile, rubber cement, recorcinol glue, and polyamide;
b) generating at least one sensor area (122, 122') by depositing a photosensitive material (128) on an at least partially transparent substrate layer (114), wherein the at least one sensor area (122, 122') is designed to generate at least one sensor signal in a manner dependent on an illumination of the at least one sensor area (122, 122') by the incident light beam (120), wherein the at least one sensor area comprises at least two individual sensor areas (122, 122'), wherein adjacent sensor areas (122, 122') are separated with respect to each other by a gap (126);
c) placing the substrate layer (114) carrying the at least one sensor area (122, 122') onto the absorptive layer (138); and
d) providing an evaluation device (150), wherein the evaluation device (150) is designed to generate at least one item of information by evaluating the at least one sensor signal.

12. The method according to claim 11, wherein the infrared absorbing pigments (144) are selected from a group consisting of carbon black (146), graphite, carbon, vantablack, LaB6, copper bronze, copper chromite black, cobalt chromite black, and manganese ferrite black.

* * * * *